(12) United States Patent
Hill et al.

(10) Patent No.: US 7,489,407 B2
(45) Date of Patent: Feb. 10, 2009

(54) ERROR CORRECTION IN INTERFEROMETRY SYSTEMS

(75) Inventors: Henry A. Hill, Tucson, AZ (US); Jeffrey Johnston, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 392 days.

(21) Appl. No.: 11/246,942

(22) Filed: Oct. 6, 2005

(65) Prior Publication Data
US 2006/0072119 A1    Apr. 6, 2006

Related U.S. Application Data

(60) Provisional application No. 60/616,575, filed on Oct. 6, 2004.

(51) Int. Cl.
*G01B 11/02* (2006.01)
(52) U.S. Cl. .................................................. 356/508
(58) Field of Classification Search ................. 356/486, 356/487, 493, 498, 500, 508, 509
See application file for complete search history.

(56) References Cited

U.S. PATENT DOCUMENTS

| | | | |
|---|---|---|---|
| 4,606,638 A | 8/1986 | Sommargren |
| 4,662,750 A | 5/1987 | Barger |
| 4,688,940 A | 8/1987 | Sommargren et al. |
| 4,711,573 A | 12/1987 | Wijntjes et al. |
| 4,714,339 A | 12/1987 | Lau et al. |
| 4,790,651 A | 12/1988 | Brown et al. |
| 4,802,765 A | 2/1989 | Young et al. |
| 4,859,066 A | 8/1989 | Sommargren |
| 4,881,816 A | 11/1989 | Zanoni |
| 4,923,301 A | 5/1990 | White |
| 4,948,254 A | 8/1990 | Ishida |
| 5,064,289 A | 11/1991 | Bockman |
| 5,114,234 A | 5/1992 | Otsuka et al. |
| 5,151,749 A | 9/1992 | Tanimoto et al. |
| 5,187,543 A | 2/1993 | Ebert |
| 5,331,400 A | 7/1994 | Wilkening et al. |
| 5,363,196 A | 11/1994 | Cameron |
| 5,404,222 A | 4/1995 | Lis |

(Continued)

FOREIGN PATENT DOCUMENTS

EP    0 895 279    2/1999

(Continued)

OTHER PUBLICATIONS

Badami et al. "Investigation of NonLinearity in High Accuracy Heterodyne Laser Interferometry." American Society for Precision Engineering, 1997 Proceedings, 16, pp. 153-156, 1997.

(Continued)

*Primary Examiner*—Tarifur Chowdhury
*Assistant Examiner*—Jonathan M Hansen
(74) *Attorney, Agent, or Firm*—Fish & Richardson P.C.

(57) ABSTRACT

In general, in one aspect, the invention features methods that include using an interferometer to produce an output beam having a phase related to an optical path difference between a path of a first beam and a path of a second beam, wherein the first beam contacts a measurement object and either the measurement object or the interferometer are coupled (e.g., directly attached) to a stage that is moveable within a reference frame. The methods further include monitoring variations in the phase while both varying an orientation of the stage with respect to at least one degree of freedom in the reference frame and keeping a reference mark on the stage in a common position with respect to the reference frame, and determining information based on the monitored variations, the information being related to a contribution to the optical path difference caused by a deviation of the path of the first or second beam from a nominal beam path.

23 Claims, 13 Drawing Sheets

U.S. PATENT DOCUMENTS

| | | |
|---|---|---|
| 5,408,318 A | 4/1995 | Slater |
| 5,483,343 A | 1/1996 | Iwamoto et al. |
| 5,491,550 A | 2/1996 | Dabbs |
| 5,537,209 A | 7/1996 | Lis |
| 5,663,793 A | 9/1997 | de Groot |
| 5,663,893 A | 9/1997 | Wampler et al. |
| 5,715,057 A | 2/1998 | Bechstein et al. |
| 5,724,136 A | 3/1998 | Zanoni |
| 5,757,160 A | 5/1998 | Kreuzer |
| 5,757,489 A | 5/1998 | Kawakami |
| 5,764,361 A | 6/1998 | Kato et al. |
| 5,764,362 A | 6/1998 | Hill et al. |
| 5,781,277 A | 7/1998 | Iwamoto |
| 5,790,253 A | 8/1998 | Kamiya |
| 5,801,832 A | 9/1998 | Van Der Brink |
| 5,838,485 A | 11/1998 | De Groot et al. |
| 5,862,164 A | 1/1999 | Hill |
| 5,877,843 A | 3/1999 | Takagi et al. |
| 5,917,844 A | 6/1999 | Hill |
| 5,951,482 A | 9/1999 | Winston et al. |
| 5,970,077 A | 10/1999 | Hill |
| 5,991,033 A | 11/1999 | Henshaw |
| 6,008,902 A | 12/1999 | Rinn |
| 6,020,964 A | 2/2000 | Loopstra et al. |
| 6,040,096 A | 3/2000 | Kakizaki |
| 6,046,792 A | 4/2000 | Van Der Werf et al. |
| 6,124,931 A | 9/2000 | Hill |
| 6,134,007 A | 10/2000 | Naraki et al. |
| 6,137,574 A | 10/2000 | Hill |
| 6,157,660 A | 12/2000 | Hill |
| 6,159,644 A | 12/2000 | Satoh et al. |
| 6,160,619 A | 12/2000 | Magome |
| 6,181,420 B1 | 1/2001 | Badami et al. |
| 6,201,609 B1 | 3/2001 | Hill et al. |
| 6,208,424 B1 | 3/2001 | de Groot |
| 6,219,144 B1 | 4/2001 | Hill |
| 6,236,507 B1 | 5/2001 | Hill et al. |
| 6,246,481 B1 | 6/2001 | Hill |
| 6,252,667 B1 | 6/2001 | Hill |
| 6,252,668 B1 | 6/2001 | Hill |
| 6,271,922 B1 | 8/2001 | Bulow et al. |
| 6,271,923 B1 | 8/2001 | Hill |
| 6,304,318 B1 | 10/2001 | Matsumoto |
| 6,313,918 B1 | 11/2001 | Hill et al. |
| 6,327,039 B1 | 12/2001 | de Groot et al. |
| 6,330,065 B1 | 12/2001 | Hill |
| 6,330,105 B1 | 12/2001 | Rozelle et al. |
| 6,384,899 B1 | 5/2002 | den Boef |
| 6,417,927 B2 | 7/2002 | de Groot |
| 6,541,759 B1 | 4/2003 | Hill |
| 6,559,457 B1 * | 5/2003 | Phan et al. ............... 250/491.1 |
| 6,700,665 B2 | 3/2004 | Hill |
| 6,710,884 B2 | 3/2004 | Hill |
| 6,738,143 B2 | 5/2004 | Chu |
| 6,743,331 B2 | 6/2004 | Takahashi et al. |
| 6,757,066 B2 | 6/2004 | Hill |
| 6,778,280 B2 | 8/2004 | De Groot et al. |
| 6,791,693 B2 | 9/2004 | Hill |
| 6,806,961 B2 | 10/2004 | Hill |
| 6,806,962 B2 | 10/2004 | Hill |
| 6,839,141 B2 | 1/2005 | Hill |
| 6,842,256 B2 | 1/2005 | Hill |
| 6,891,624 B2 | 5/2005 | Hill |
| 6,950,192 B2 | 9/2005 | Hill |
| 6,956,655 B2 | 10/2005 | Hill |
| 7,019,843 B2 | 3/2006 | Hill |
| 2001/0035959 A1 | 11/2001 | Hill |
| 2002/0001086 A1 | 1/2002 | De Groot |
| 2002/0048026 A1 | 4/2002 | Isshiki et al. |
| 2002/0089671 A1 | 7/2002 | Hill |
| 2002/0171844 A1 * | 11/2002 | Hill ............................ 356/500 |
| 2003/0090675 A1 | 5/2003 | Fujiwara |
| 2003/0174341 A1 * | 9/2003 | Hill ............................ 356/498 |
| 2003/0223077 A1 * | 12/2003 | Hill ............................ 356/498 |
| 2004/0061869 A1 | 4/2004 | Hill |
| 2004/0085546 A1 | 5/2004 | Hill |
| 2005/0018206 A1 | 1/2005 | Hill |
| 2005/0146727 A1 | 7/2005 | Hill |
| 2005/0162664 A1 | 7/2005 | Hill |
| 2005/0237536 A1 | 10/2005 | Hill et al. |
| 2005/0248772 A1 | 11/2005 | Hill et al. |

FOREIGN PATENT DOCUMENTS

| | | |
|---|---|---|
| GB | 2070276 | 9/1981 |
| JP | 7-351078 | 12/1995 |
| JP | 8-117083 | 4/1996 |
| JP | 9-178415 | 7/1997 |
| JP | 9-280822 | 10/1997 |
| JP | 10-260009 | 9/1998 |
| WO | WO 00/17605 | 3/2000 |
| WO | WO 00/66969 | 11/2000 |
| WO | WO 01/90686 | 11/2001 |
| WO | WO 03/016815 | 2/2003 |

OTHER PUBLICATIONS

Bennett, S.J.. "A Double-Passed Michelson Interforometer." Optics Communications, 4:6, pp. 428-430, 1972.

Bobroff, Norman. "Recent advances in a displacement measuring interferometry." Meas. Sci. Technol. 4, pp. 907-926, 1993.

Bobroff, Norman. "Residual errors in laser interferometry from air turbulence and nonlinearity." Applied Optics, 26:13, pp. 2676-2682, 1987.

Estler, W.T. "High-Accuracy Displacement Interferometry in Air," Appl. Opt. 24:6, pp. 808-815, 1985.

Hines et al. Sub-Nonometer Laser Metrology—Some Techniques and Models. ESO Conference on High Resolution Imaging by Interferometry II, pp. 1195-1204, 1991.

Ishida, A. "Two Wavelength Displacement-Measuring Interferometer using Second-Harmonic Light to Eliminate Air-Turbulence-Induced Errors," Jpn. J. Appl. Phys. 28:3, pp. L473-475, 1989.

J.-P. Monchalin et al., "Accurate Laser Wavelength Measurement With A Precision Two-Beam Scanning Michelson Interferometer" *Applied Optics*, 20(5), 736-757, (1981).

Jones, F.E. "The Refractivity of Air," J. Res. NBS 86:1, pp. 27-32, 1981.

Liang, J. et al., "Objective measurement of wave aberrations of the human eye with the use of a Hartmann-Shack wave-front sensor," J. Opt. Soc. Am. (A), 11, 1949-57 (1994).

Liang, J. and D.R. Williams "Aberrations and retinal image quality of the normal human eye," J. Opt. Soc. Am. (A), 14, 2873-83 (1997).

Lis, S.A. "An Air Turbulence Compensated Interferometer for IC Manufacturing," SPIE 2440, 1995.

Mauer, Paul. "Phase Compensation of Total Internal Reflection." J. Opt. Soc. Am., 56:9, pp. 1219-1221, 1966.

Oka et al. "Polarization heterodyne interferometry using another local oscillator beam." Optics Communications, 92, pp. 1-5, 1992.

Player, M.A. "Polarization properties of a cube-corner reflector." J. Mod. Opt., 35:11, pp. 1813-1820, 1988.

P.M. Prieto et al., "Analysis of the performance of the Hartmann-Shack sensor in the human eye," J. Opt. Soc. Am. (A), 17, 1388-98 (2000).

Wu et al. "Analytical modeling of the periodic nonlinearity in heterodyne interferometry." Applied Optics, 37:28, pp. 6696-6700, 1998.

Zhu et al., "Long-Arm Two-Color Interferometer for Measuring the Change of Air Refractive Index," SPIE 1319, pp. 538-539, 1990.

* cited by examiner

ERROR CORRECTION IN INTERFEROMETRY SYSTEMS

CROSS-REFERENCE TO RELATED APPLICATIONS

This application claims priority under 35 USC 119(e)(1) to Provisional Patent Application No. 60/616,575, entitled "COMPENSATION FOR GEOMETRIC ERRORS IN INTERFEROMETER METROLOGY SYSTEMS," filed on Oct. 6, 2004, the entire contents of which are hereby incorporated by reference.

BACKGROUND

This invention relates to interferometers, e.g., linear and angular displacement measuring, that measure linear and angular displacements of a measurement object such as a mask stage or a wafer stage in a lithography scanner or stepper system.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from a reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is usually the wavelength of the measurement beam, n is the refractive index of the medium through which the light beams travel, e.g., air or vacuum, and p is the number of passes to the reference and measurement objects. Changes in the phase of the measured interference signal correspond to changes in the relative position of the measurement object, e.g., a change in phase of $2\pi$ corresponds substantially to a distance change L of $\lambda/(2np)$. Distance 2L is a round-trip distance change or the change in distance to and from a stage that includes the measurement object. In other words, the phase $\Phi$, ideally, is directly proportional to L, and can be expressed as $$\Phi = 2pkL\cos^2\theta \qquad (1)$$

for a plane mirror interferometer, e.g., a high stability plane mirror interferometer, where $$k = \frac{2\pi n}{\lambda}$$

and $\theta$ is the orientation of the measurement object with respect to a nominal axis of the interferometer. This axis can be determined from the orientation of the measurement object where $\Phi$ is maximized. Where $\theta$ is small, Equation (1) can be approximated by $$\Phi = 2pkL(1-\theta^2) \qquad (2)$$

Unfortunately, the observable interference phase, $\tilde{\Phi}$, is not always identically equal to phase $\Phi$. Many interferometers include, for example, non-linearities such as those known as "cyclic errors." The cyclic errors can be expressed as contributions to the observable phase and/or the intensity of the measured interference signal and have a sinusoidal dependence on the change in for example optical path length 2pnL. A first order cyclic error in phase has, for example, a sinusoidal dependence on $(4\pi pnL)/\lambda$ and a second order cyclic error in phase has, for example, a sinusoidal dependence on $2(4\pi pnL)/\lambda$. Higher order cyclic errors can also be present as well as sub-harmonic cyclic errors and cyclic errors that have a sinusoidal dependence of other phase parameters of an interferometer system comprising detectors and signal processing electronics.

There are in addition to the cyclic errors, non-cyclic errors. Non-cyclic errors include both non-linear non-cyclic errors and geometric non-cycle errors.

An example of a source of a non-linear non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kurnit, A. Szöke, F. Zernike, P. H. Lee, and A. Javan, "Accurate Laser Wavelength Measurement With A Precision Two-Beam Scanning Michelson Interferometer," *Applied Optics*, 20(5), 736-757, 1981.

A second source of non-cyclic error is the effect of "beam shearing" of optical beams across interferometer elements and the lateral shearing of reference and measurement beams one with respect to the other. Beam shearing can be caused, for example, by a change in direction of propagation of the input beam to an interferometer or a change in orientation of the object mirror in a double pass plane mirror interferometer such as a differential plane mirror interferometer (DPMI) or a high stability plane mirror interferometer (HSPMI).

Geometric non-cyclic errors (or simply "geometric errors") refers to errors in interferometry measurements that arise from a deviation of one or more beams from a nominal beam path and cause an optical path deviation from the assumed optical path. Conventionally, the position of a measurement object in a reference frame is calculated assuming that the beams propagate along nominal paths in the reference frame. Thus, while a measured interference phase is proportional to the optical path difference between the measurement and reference beams, a geometric error causes a deviation in the determined position of the measurement object in the reference frame from its actual position.

Geometric errors are caused by imperfections in the interferometer optics, the measurement object, or the source. For example, surface or bulk imperfections in one or more optics in the interferometer or the measurement object can cause geometric errors. Surface or bulk imperfections can be caused by, e.g., bulk inhomogeneities or errors in a surface figure. Furthermore, misalignment of one or more optical components in the interferometer or of the interferometer light source can cause geometric errors.

The effect of contributions to the observable phase due to cyclic and non-cyclic errors can be reduced by quantifying these errors and correcting subsequent measurements with this data. Different techniques for quantifying cyclic errors are described in commonly owned U.S. Pat. Nos. 6,252,668, 6,246,481, 6,137,574, and U.S. patent application Ser. No. 10/287,898 entitled "INTERFEROMETRIC CYCLIC ERROR COMPENSATION" filed Nov. 5, 2002 by Henry A. Hill, the entire contents each of which are incorporated herein by reference. In order to compensate for these contributions, cyclic error compensating systems and methods can be used to determine a cyclic error function characterizing the cyclic error contribution to the observed phase. Examples of apparatus and details of methods that can be used to characterize non-cyclic errors in interferometers and interferometer components are described in U.S. patent application Ser. No. 10/366,587 entitled "CHARACTERIZATION AND COMPENSATION OF NON-CYCLIC ERRORS IN INTERFEROMETRY SYSTEMS," to Henry A. Hill, filed on Feb. 12, 2003, the entire contents of which are incorporated herein by reference.

SUMMARY

In many applications, such as in lithography tools, interferometry systems are used to monitor the position of a moveable stage with respect to a reference frame (e.g., defined by the position of the lithography tool's projection system). Typically, lithography tools will include additional metrology devices, such as one or more alignment apparatus (e.g., optical alignment microscopes) for locating various features on the stage. These features include, for example, reference marks on a surface of the stage or on an article carried by the stage, such as a semiconductor wafer, a LCD substrate, or a reticle, or a die site on a wafer.

Typically, alignment apparatus are positioned away from the interferometer axes. Accordingly, off-axis measurement effects, such as Abbé offsets, need to be considered when determining the location of a reference mark when it is located by an off-axis alignment apparatus. Furthermore, interferometer errors, such as geometric and non-linear non-cyclic errors, affect the accuracy of measurements of reference mark locations when the reference mark is identified using an alignment apparatus (e.g., in the field of view of an alignment scope). The effect of these errors can be reduced by appropriately considering the errors contribution to a measured phase when determining the position of the off-axis mark.

In certain formalisms, the relationship between the position of a reference mark located by an alignment tool and the position of the stage monitored using the interferometer allows terms that have differing functional dependence on the stage orientation to be separated and determined independently. For example, terms that are linear and quadratic in the stage orientation can be separated and determined independently. As a result, values for various error correction parameters (e.g., geometric error correction parameters) can be determined from interferometer data acquired using relatively straight-forward procedures. Moreover, this data can be acquired while the interferometry system is installed in the lithography tool, and can be acquired using largely automated procedures, reducing tool maintenance down-time and human error.

In general, in one aspect, the invention features methods that include using an interferometer to produce an output beam having a phase related to an optical path difference between a path of a first beam and a path of a second beam, wherein the first beam contacts a measurement object and either the measurement object or the interferometer are coupled (e.g., directly attached) to a stage that is moveable within a reference frame. The methods further include monitoring variations in the phase while both varying an orientation of the stage with respect to at least one degree of freedom in the reference frame and keeping a reference mark on the stage in a common position (support in spec) with respect to the reference frame, and determining information based on the monitored variations, the information being related to a contribution to the optical path difference caused by a deviation of the path of the first or second beam from a nominal beam path.

Implementations of the methods can include one or more of the following features and/or features of other aspects. The reference mark can be kept in a common position by maintaining the reference mark in alignment with an alignment tool. The alignment tool can be an optical alignment scope.

Monitoring the variations in the phase can include monitoring the orientation of the stage with respect to the at least one degree of freedom. The information can be related to deviations of the actual stage orientation from the monitored orientation. The information can include contributions to the deviations of the actual stage orientation from the monitored stage orientation due to imperfections in the interferometer. The measurement object can be a plane mirror measurement object and the information includes contributions to the deviations of the actual stage orientation from the monitored stage orientation due to imperfections in the plane mirror. The stage orientation can be monitored using the interferometer. The degree of freedom can correspond to the stage pitch in the reference frame. The degree of freedom can correspond to the stage yaw in the reference frame.

The information can be determined based on additional monitored variations of the phase associated with varying an orientation of the stage with respect to the reference frame while keeping a second alignment mark on the stage at a common position with respect to the reference frame. The information can be determined based on a difference between the phase variations monitored with the first alignment mark substantially stationary with respect to the reference frame and the additional monitored phase variations for corresponding stage orientations.

The reference mark can be a mark on a surface of the stage. The reference mark can be a mark on a surface of a wafer, a LCD substrate, or a reticle supported by the stage. The measurement object can be a plane mirror measurement object. The measurement beam can contact the measurement object more than once.

In another aspect, the invention features methods that include using an interferometry system to monitor the position of a moveable stage with respect to a reference frame; and using information determined according to the methods of the foregoing aspect to reduce errors in the monitored position. Monitoring the position of the stage can include monitoring the location of a die site on a wafer supported by the stage with respect to the reference frame.

In general, in a further aspect, the invention features systems that include a stage that is movable with respect to a reference frame, an interferometer configured to produce an output beam having a phase related to an optical path difference between a path of a first beam and a path of a second beam, wherein the first beam contacts a measurement object and either the measurement object or the interferometer are coupled (e.g., directly attached) to the stage. The systems also include an electronic controller configured to monitor variations in the phase while causing the system to vary an orientation of the stage with respect to at least one degree of freedom in the reference frame and keeping a reference mark on the stage in a common position with respect to the reference frame, the electronic controlled being further configured to determine information based on the monitored variations, the information being related to a contribution to the optical path difference caused by a deviation of the path of the first or second beam from a nominal beam path.

Embodiments of the systems may include one or more of the following features and/or features of other aspects. For example, the system can further include an alignment tool configured to locate a reference mark on the stage when the reference mark is located at the common position. The alignment tool can be an optical alignment scope.

The interferometer can be a multiple pass interferometer. The interferometer can be part of an interferometry assembly configured to monitor the position of the measurement object with respect to multiple degrees of freedom.

The measurement object can be a plane mirror measurement object. The measurement object can be attached to the stage. The interferometer can be attached to the stage. The stage can be configured to support a wafer, a reticle, or a LCD substrate.

In a further aspect, the invention features lithography systems for use in fabricating integrated circuits on a wafer, where the systems include an illumination system for imaging spatially patterned radiation onto the wafer, a system mentioned above for monitoring the position of the wafer relative to the imaged radiation, and a positioning system for adjusting the position of the stage relative to the imaged radiation, wherein the wafer is supported by the stage.

In another aspect, the invention features lithography systems for use in fabricating integrated circuits on a wafer, where the systems include an illumination system including a radiation source, a mask, a positioning system, a lens assembly, and a system mentioned above, wherein during operation the source directs radiation through the mask to produce spatially patterned radiation, the positioning system adjusts the position of the mask relative to the radiation from the source, the lens assembly images the spatially patterned radiation onto the wafer supported by the stage, and the system monitors the position of the mask relative to the radiation from the source.

In a further aspect, the invention features beam writing systems for use in fabricating a lithography mask, where the systems include a source providing a write beam to pattern a substrate, a beam directing assembly for delivering the write beam to the substrate, a system mentioned above for monitoring the position of the stage relative to the beam directing assembly, and a positioning system for positioning the stage and beam directing assembly relative one another, wherein the substrate is supported by the stage.

In another aspect, the invention features lithography methods for use in fabricating integrated circuits on a wafer, the methods including using the above-mentioned methods to monitor the position of the stage, wherein the wafer is supported on the stage, imaging spatially patterned radiation onto the wafer, and adjusting the position of the stage.

In a further aspect, the invention features lithography methods for use in the fabrication of integrated circuits including directing input radiation through a mask to produce spatially patterned radiation, positioning the mask relative to the input radiation, monitoring the position of the mask relative to the input radiation using the above-mentioned methods, and imaging the spatially patterned radiation onto a wafer.

In a further aspect, the invention features lithography methods for fabricating integrated circuits on a wafer including positioning a first component of a lithography system relative to a second component of a lithography system to expose the wafer to spatially patterned radiation, and monitoring the position of the first component relative to the second component using the above-mentioned methods.

In another aspect, the invention features methods for fabricating integrated circuits that include the foregoing lithography methods and/or the foregoing lithography systems.

In yet a further aspect, the invention features methods for fabricating a lithography mask, the methods including directing a write beam to a substrate to pattern the substrate, positioning the substrate relative to the write beam, and monitoring the position of the substrate relative to the write beam using the above-mentioned methods.

Among other advantages, the invention features methods for improving the accuracy of interferometry measurements, including, for example, displacement and angular orientation measurements of a measurement object. Measurement accuracy is improved by characterizing certain errors that occur in the system, and using that information to reduce (e.g., eliminate) those errors while the system is in use.

Methods for characterizing geometric errors can be implemented using the interferometry system itself, without the need for additional metrology equipment. Accordingly, where interferometry systems are implemented in a manufacturing environment, error characterization can be performed without substantial downtime of the manufacturing equipment.

A number of references are incorporated into this application by reference. In case of conflict, the present specification will control. The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
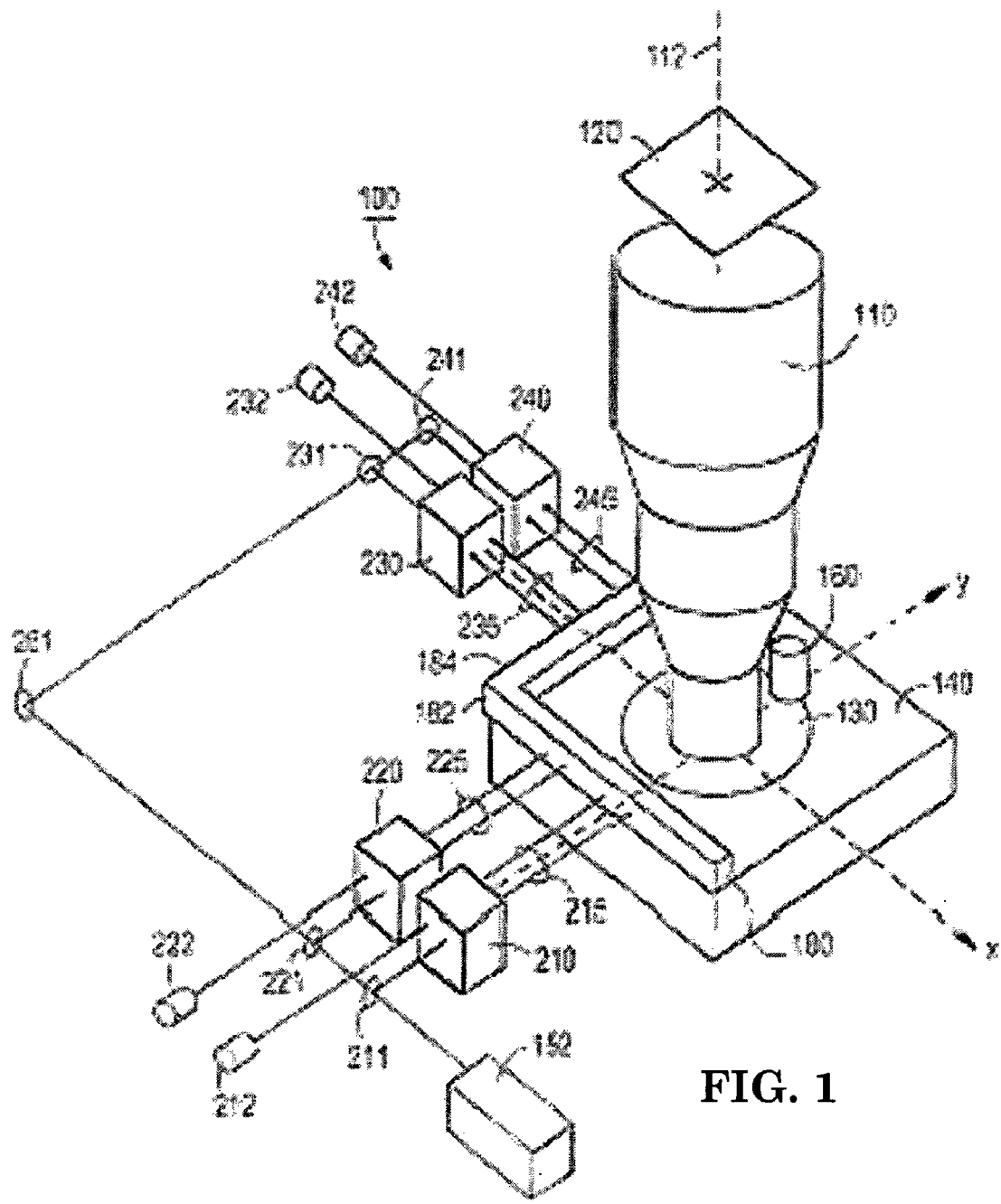
FIG. 1 and FIG. 2 are a perspective and plan view, respectively, of an embodiment of a lithography tool that includes an interferometry system.
Figure 2:
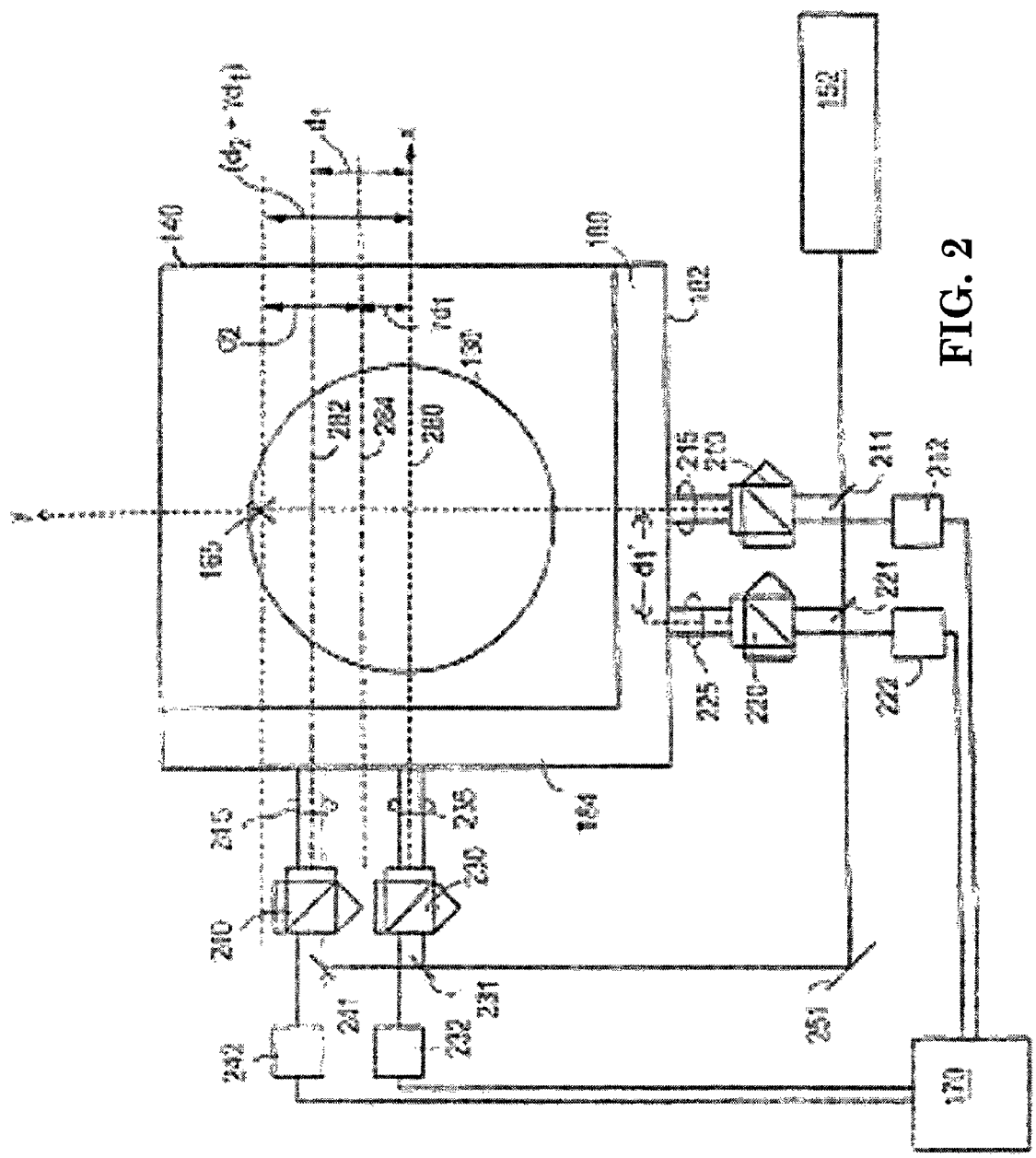

Referring now to FIG. 1 and FIG. 2, a lithography tool 100 includes an exposure system 110 positioned to image a reticle 120 onto an exposure region of a wafer 130. Wafer 130 is supported by a stage 140, which scans wafer 130 in a plane orthogonal to an axis 112 of exposure system 110. A stage mirror 180 is mounted on stage 140. Stage mirror 180 includes two nominally orthogonal reflecting surfaces 182 and 184.

An interferometry system monitors the position of stage 140 along orthogonal x- and y-measurement axes. The x- and y-axes intersect with axis 112 of exposure system 110. The interferometry system includes four interferometers 210, 220, 230, and 240. Interferometers 210 and 220 respectively direct measurement beams 215 and 225 parallel to the y-axis to reflect twice from mirror surface 182. Similarly, interferometers 230 and 240 respectively direct measurement beams 235 and 245 parallel to the x-axis to reflect twice from mirror surface 184. After reflection from the mirror surfaces, each measurement beam is combined with a reference beam to form an output beam. A phase of each output beam is related to the optical path length difference between the measurement and reference beam paths. Detectors 212, 222, 232, and 242 detect the output beams from interferometers 210, 220, 230, and 240, respectively, and communicate optical path length difference information to an electronic controller 170, which determines the stage position from the information and adjusts the position of stage 140 relative to exposure system 110 accordingly.

Interferometers 210, 220, 230, and 240 are positioned so that their beams are substantially co-planar. In some embodiments, the interferometry system can include additional interferometers configured to monitor the position of stage mirror surface 182 and/or 184 along additional axis parallel to the y- and/or x-axes, respectively. The additional interferometers can be positioned so that their measurement beams strike the mirror surfaces at locations that are displaced along the z-direction with respect to the measurement beams of interferometers 210, 220, 230, and 240.

The input beam for each interferometer is derived from a common source, laser light source 152. Beam splitters 211, 221, 231, and mirrors 241 and 251 direct light from light source 152 to the interferometers. Each interferometer splits its input beam into a measurement beam and a reference beam. In the present embodiment, each interferometer directs its respective measurement beam along a path that contacts a surface of mirror 180 twice.

Interferometers 230 and 210 monitor co-ordinates $x_1$ and $y_1$ of the location of mirror surfaces 184 and 182 along the x- and y-axes, respectively. Additionally, interferometers 240 and 220 monitor the location of stage 140 along a second set of axes, offset from but parallel to the x- and y-axes, respectively. The secondary measurements provide co-ordinates $x_2$ and $y_2$ of mirror surfaces 184 and 182, respectively. The separations of these secondary measurement axes from the x- and y-axes are known, and are indicated as $d_1$ and $d_1'$ in FIG. 2.

Lithography tool 100 also includes an alignment scope 160 positioned to locate alignment marks on the surface of wafer 130 and/or stage 140. Alignment scope 160 is aligned on the y-axis, but away from the x-axis. Typically, alignment scope 160 is an optical scope (e.g., a microscope).

Figure 3:
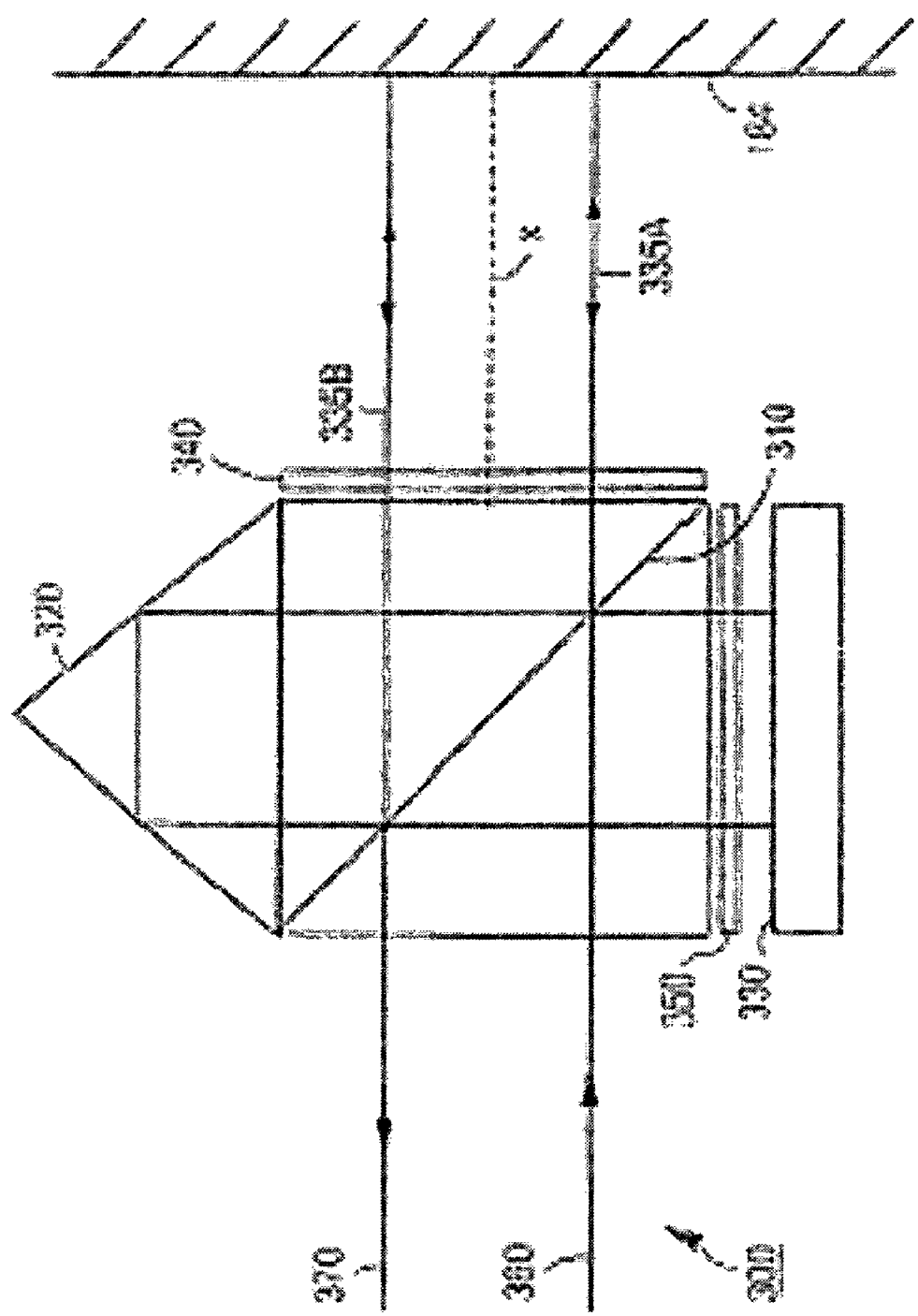
FIG. 3 is a schematic diagram of a high stability plane mirror interferometer (HSPMI).

In some embodiments, interferometers 210, 220, 230, and 240 are high stability plane mirror interferometers (HSPMIs). Referring to FIG. 3, an HSMPI 300 includes a polarizing beam splitter (PBS) 310, a retroreflector 320, and a reference mirror 330. HSPMI 300 also includes quarter wave plates 340 and 350, positioned between PBS 310 and mirror surface 184 or reference mirror 330, respectively.

During operation, PBS 310 splits the input beam, indicated as beam 360 in FIG. 3, into orthogonally polarized components. One component, measurement beam 335A, is transmitted by PBS 310 and reflects from mirror surface 184 back towards PBS 310. On its return to PBS 310, the polarization state of the measurement beam is now orthogonal to its original polarization state due to the passing through quarter wave plate 340 twice, and the measurement beam is reflected by PBS 310 towards retroreflector 320. Retroreflector 320 directs the measurement beam back towards PBS 310, which reflects the measurement beam towards mirror surface 184. On the second pass to mirror surface 184, the measurement beam is indicated as beam 335B. Again, mirror surface 184 reflects beam 335B towards PBS 310. The double pass through quarter wave plate 340 transforms the polarization state of the measurement beam back to its original state, and it is transmitted by PBS 310 and exits HSPMI 300 as a component of an output beam 370.

The reference beam is the component of input beam 360 initially reflected by PBS 310. The reference beam passes between PBS 310 and reference mirror 330 twice. On each pass, quarter wave plate 350 transforms the polarization state of the reference beam by 90°. Thus, after the first pass of the reference beam to reference mirror 330, PBS 310 transmits the reference beam. After the reference beam's second pass to reference mirror 330, PBS 310 reflects the reference beam, which exits the interferometer 300 as a component of output beam 370. The output beam includes phase information about the optical path length difference between the reference and measurement beams. The system can monitor variations in this optical path length difference by monitoring variations in the output beam phase.

Geometric Error Correction

As discussed supra, measurements made using interferometry systems, such as the interferometry system in lithography tool 100, are subject to geometric errors. Geometric error correction factors can be used to compensate for these errors. These geometric error correction factors can be into two categories based on the source of the error. Interferometer geometric error factors are used to correct for optical path differences caused by beam deviations that originate in the interferometer excluding the effect of surface figure of the measurement and reference object mirrors. Measurement object geometric error factors are used to correct for optical path differences caused by beam deviations that result from errors in the surface figure of the measurement object mirror.

Figure 4A:
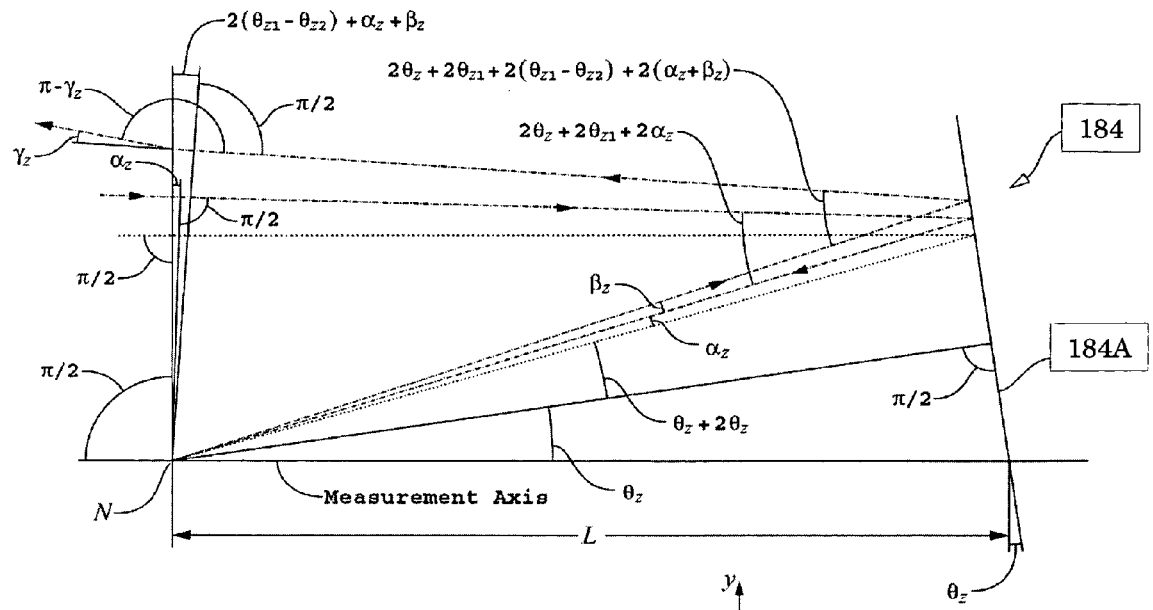
FIG. 4(a) is a schematic diagram showing relative beam directions for a double pass interferometer to a plane mirror measurement object.
Figure 4B:
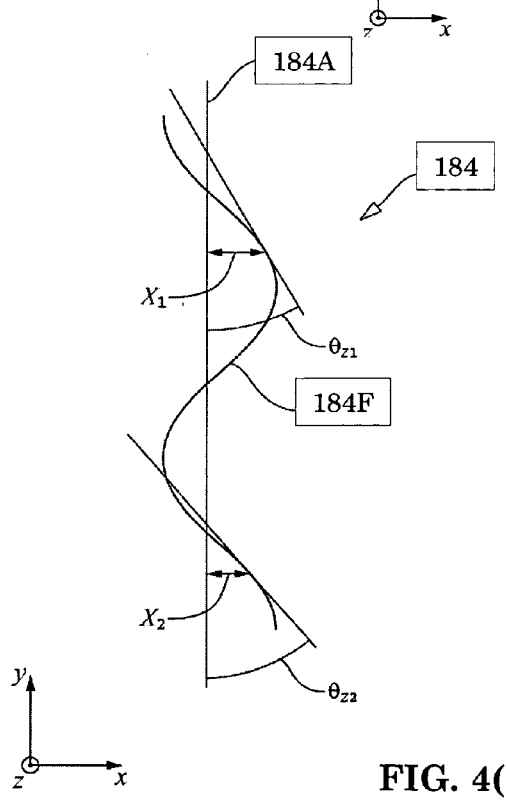
FIG. 4(b) is a schematic diagram showing imperfections in a plane mirror measurement object.

Reference is made to FIG. 4(a) in discussing the relationship between a change in a physical displacement L to be measured by HSMPI 300 and the measured phase $\Phi$ of the heterodyne signal from HSPMI 300. Phase $\Phi$ is expressed as the sum of three phases $\Phi_M$, $\Phi_S$, and $\Phi_R$, i.e., $$\Phi = \Phi_M + \Phi_S - \Phi_R \quad (3)$$

where $\Phi_M$ is the contribution to phase $\Phi$ from the measurement beam path in HSMPI 300, including effects of errors in the surface figure of the measurement object, $\Phi_S$ is the phase contribution introduced by a relative lateral shear of the measurement and reference beam components of output beam 370 and a relative difference in directions of propagation of the measurement and reference beam components of output beam 370, and $\Phi_R$ is the contribution to phase $\Phi$ from the reference beam path in HSMPI 300. With reference to FIGS. 4(a) and 4(b), phases $\Phi_M$ and $\Phi_S$ are given to a good approximation by the equations tively; $\theta_{z1}$ and $\theta_{z2}$ are the local slopes of surface 184F of object mirror 184 measured in the x-y plane at the positions where the first and second pass measurement beams 335A and 335B, respectively, contact object mirror 184; $\theta_{y1}$ and $\theta_{y2}$ are the local slopes of surface 184F of object mirror 184 measured in the x-z plane at the positions where the first and second pass measurement beams 335A and 335B, respectively, contact object mirror 184; $\alpha_z$ and $\alpha_y$ are deviations in the direction of the input beam with respect to the interferometer measurement axis in the x-y and x-z planes, respectively; $\beta_z$ and $\beta_y$ are deviations in the direction of the component of second pass measurement beam 335B propagating toward object mirror 184 with respect to the direction of propagation of the component of the first pass measurement beam 335A propagating toward HSMPI 300 in the x-y and x-z planes, respectively; $\gamma_z$ and $\gamma_y$ are deviations in the direction of the measurement beam component of output beam 370 with respect to the direction of component of the second pass measurement beam 335B propagating toward HSMPI 300 in the x-y and x-z planes, respectively; the terms $X_1$ and $X_2$ are the local displacements surface 184F from surface 184A of object mirror 184 measured in the x-y plane at the positions where the first and second pass measurement beams 335A $$\Phi_M kL\cos\theta_z\cos\theta_y \left[ \frac{1}{\cos(\alpha_y + \theta_y + 2\theta_{1y})\cos(\alpha_z + \theta_z + 2\theta_{1z})} + \frac{\cos(\alpha_y + 2\theta_y + 2\theta_{1y})\cos(\alpha_z + 2\theta_z + 2\theta_{1z})}{\cos(\alpha_y)\cos(\alpha_y + \theta_y + 2\theta_{1y})\cos(\alpha_z)\cos(\alpha_z + \theta_z + 2\theta_{1z})} + \frac{1}{\cos(\alpha_y + \beta_y + \theta_y + 2\theta_{1y})\cos(\alpha_z + \beta_z + \theta_z + 2\theta_{1z})} + \frac{\cos(\alpha_y + \beta_y + 2\theta_y + 2\theta_{1y})}{\cos(\alpha_y + \beta_y + \theta_y + 2\theta_{1y})\cos(\alpha_y + \beta_y + 2(\theta_{1y} - \theta_{2y}))} \times \frac{\cos(\alpha_z + \beta_z + 2\theta_z + 2\theta_{1z})}{\cos(\alpha_z + \beta_z + \theta_z + 2\theta_{1z})\cos(\alpha_z + \beta_z + 2(\theta_{1z} - \theta_{2z}))} \right] + \quad (4)$$

$$L_D \frac{1}{\cos(\alpha_y + \beta_y + \gamma_y + 2(\theta_{1y} - \theta_{2y}))\cos(\alpha_z + \beta_z + \gamma_z + 2(\theta_{1z} - \theta_{2z}))} + 2(X_1 + X_2)$$

$$\Phi_S = \frac{kL}{4} \left\{ \begin{array}{l} (\alpha_z + \beta_z + \gamma_z + 2(\theta_{1z} - \theta_{2z}) + \alpha_{zR} + \beta_{zR} + \gamma_{zR} + 2(\theta_{1zR} - \theta_{2zR})) \times \\ \left[ \begin{array}{l} -(4\alpha_z + 2\beta_z + 6\theta_{1z} - 2\theta_{2z} + 4\theta_z) \\ +(L_R/L)(4\alpha_{zR} + 2\beta_{zR} + 6\theta_{1zR} - 2\theta_{2zR} + 4\theta_{zR}) \\ -\xi((\alpha_z - \alpha_{zR}) + (\beta_z - \beta_{zR}) + (\gamma_z - \gamma_{zR}) + 2(\theta_{1z} - \theta_{2z}) - 2(\theta_{1zR} - \theta_{2zR})) \end{array} \right] + \\ (\alpha_y + \beta_y + \gamma_y + 2(\theta_{1y} - \theta_{2y}) + \alpha_{yR} + \beta_{yR} + \gamma_{yR} + 2(\theta_{1yR} - \theta_{2yR})) \times \\ \left[ \begin{array}{l} -(4\alpha_y + 2\beta_y + 6\theta_{1y} - 2\theta_{2y} + 4\theta_y) \\ +(L_R/L)(4\alpha_{yR} + 2\beta_{yR} + 6\theta_{1yR} - 2\theta_{2yR} + 4\theta_{yR}) \\ -\xi((\alpha_y - \alpha_{yR}) + (\beta_y - \beta_{yR}) + (\gamma_y - \gamma_{yR}) + 2(\theta_{1y} - \theta_{2y}) - 2(\theta_{1yR} - \theta_{2yR})) \end{array} \right] \end{array} \right\} \quad (5)$$

where L is the distance between point N that depends on the refractive indices of the media in the measurement beam path, the conjugate of the nodal point of retroreflector 320 as seen through polarization beam-splitter 310, and surface 184A of object mirror 184 along a measurement axis as defined for interferometer 300; $L_R$ is the distance between point N and the reference mirror 42 along a measurement axis as defined for interferometer 300; k is a wavenumber corresponding to wavelength $\lambda$ of source 115; $\theta_z$ and $\theta_y$ are the rotations of surface 184A of object mirror 184 about z and y axes, respecand 335B, respectively, contact object mirror 184; and $\xi$ is the ratio of the measurement beam path length L between the exit face of HSPMI 300 and the photosensitive surface of detector 120 and the measurement beam path length between HSMPI 300 and measurement object 184 (which is L). The terms that have a subscript R represent parameters associated with the reference beam, e.g., the term $(\theta_z)_R$ in Equation (5) represents the rotation about the z axis of the conjugate of reference mirror 42 located in the space of measurement beam 121 and nominally parallel to surface 184A of object mirror 184.

The location of the conjugate of the nodal point of retroreflector 320 is displaced from the conjugate of the apex of retroreflector 320 as seen through polarization beam-splitter 310 depending on the physical path length of the measurement path in polarization beam-splitter 310 and retroreflector 320 and magnitude of the index of refraction of polarization beam-splitter 310 and retroreflector 320. The nodal point refers to the location of the image of the vertex of retroreflector 320 as seen from outside the retroreflector. The value for L may be written for example as $$L = n_a l_M + \frac{n_a^2 l_{M,I}}{n_I} \tag{6}$$

where $l_M$ is the one way physical path length of the measurement path in air for $\theta_y=0$ and $\theta_z=0$, $n_I$ is the refractive index of the glass portion of an interferometer comprising a single medium, and $l_{M,I}$ is the one way physical path length of the measurement beam in the glass portion of the interferometer for $\theta_y=0$ and $\theta_z=0$. The length $l_{M,I}$ corresponds to the respective physical path length of a beam at $\theta_y=0$ and $\theta_z=0$, respectively, in retroreflector 320 measured from the apex of retroreflector 320.

Surface 184F of object mirror 184 corresponds to the physical surface of object mirror 184 and can be characterized by techniques described subsequently. Surface 184A of object mirror 184 represents an average of the physical surface 184F according to an algorithm such as a least-squares fit. In preferred embodiments, the characterization of the object mirror surface has a resolution on the order of, or greater than, the resolution of the measurement beam diameter.

An equation for $\Phi_R$ is of the same general form as that of the equation given for $\Phi_M$, i.e., Equation (4). The corresponding equation $\Phi_R$ may be used to evaluate non-linear errors that arise from the reference beam path in an end use applications such as an interferometer configured with a column reference, where a polarization leakage filter is used such as described in Provisional Patent Application No. 60/303,299 entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," to Peter de Groot et al. and its corresponding utility application U.S. patent application Ser. No. 10/174,149, or where elements of the interferometer are rotated or tilted to eliminate certain cyclic non-linear errors such as described in Provisional Patent Application No. 60/314,490 entitled "TILTED INTERFEROMETER" to Henry A. Hill and its corresponding utility application U.S. patent application Ser. No. 10/218,965. The contents of both cited Provisional Patent Applications and both Utility U.S. Patent Applications are hereby incorporated by reference in their entirety.

The differences $\delta_z$ and $\delta_y$ in the directions of propagation of measurement and reference beam components of output beam 370 in the x-y and x-z planes, respectively, are $$\delta_z = [2(\theta_{z1}-\theta_{z2})-2(\theta_{z1}-\theta_{z2})_R + (\alpha_z-\alpha_{zR}) + (\beta_z-\beta_{zR}) + (\gamma_z-\gamma_{zR})], \tag{7}$$

$$\delta_y = [2(\theta_{y1}-\theta_{y2})-2(\theta_{x1}-\theta_{x2})_R + (\alpha_y-\alpha_{yR}) + (\beta_y-\beta_{yR}) + (\gamma_y-\gamma_{yR})]. \tag{8}$$

Note, for example, that where $\theta_{z1}=\theta_{z2}$, the contributions to $\delta_z$ due to variations in the slope of the stage mirror in the x-y plane at the points at which the measurement beam contacts the stage cancel each other out.

The subsequent description of Equation (3) is in terms of the contributions that arise from $\Phi_M$ and $\Phi_S$ since, as noted above, the description of the contribution of $\Phi_R$ is the same as the corresponding portion of the description of the contribution of $\Phi_M$. The contributions of $\Phi_M$ and $\Phi_S$ given by Equations (4) and (5) may be expanded in a power series as $$\frac{\Phi_M + \Phi_S}{k} = L \begin{cases} 4 - 4\theta_z^2 + 2(\theta_{1z}-\theta_{2z})^2 + 4\theta_{1z}^2 + \alpha_z^2 - 2\theta_{2z}(\alpha_z+\beta_z) + \\ (\alpha_z+\beta_z)^2 + \theta_{1z}(6\alpha_z+4\beta_z) - \\ \frac{1}{2}(\alpha_z+\beta_z+\gamma_z+2(\theta_{1z}-\theta_{2z}))(4\alpha_z+2\beta_z+6\theta_{1z}-2\theta_{2z}+4\theta_z) - \\ 4\theta_y^2 + 2(\theta_{1y}-\theta_{2y})^2 + 4\theta_{1y}^2 + \alpha_y^2 - 2\theta_{2y}(\alpha_y+\beta_y) + \\ (\alpha_y+\beta_y)^2 + \theta_{1y}(6\alpha_y+4\beta_y) - \\ \frac{1}{2}(\alpha_y+\beta_y+\gamma_y+2(\theta_{1y}-\theta_{2y}))(4\alpha_y+2\beta_y+6\theta_{1y}-2\theta_{2y}+4\theta_y) \end{cases} + 2(X_1+X_2) \tag{9}$$

wherein the leading terms have been retained up through quadratic terms and the terms containing L have been cancelled out. In order to make the contributions of the deviations from the nominal path more easily identifiable, Equation (9) may be rewritten as $$\frac{\Phi_M + \Phi_S}{k} = \tag{10}$$

$$\left\{ \begin{array}{l} \left[1 - \left[\theta_z + \frac{1}{4}[\alpha_z + \beta_z + \gamma_z + 2(\theta_{z1} - \theta_{z2})]\right]^2 - \right. \\ \left[\theta_y + \frac{1}{4}[\alpha_y + \beta_y + \gamma_y + 2(\theta_{y1} - \theta_{y2})]\right]^2 + \\ \frac{1}{16}(\alpha_z + \beta_z + \gamma_z + 2(\theta_{1z} - \theta_{2z}))^2 + \frac{1}{16}(\alpha_y + \beta_y + \gamma_y + 2(\theta_{y1} - \theta_{y2}))^2 + \\ +4L \left\{ \frac{1}{2}(\theta_{z1} - \theta_{z2})^2 + \theta_{z1}^2 + \frac{1}{4}\alpha_z^2 - \frac{1}{2}\theta_{z2}(\alpha_z + \beta_z) + \frac{1}{4}(\alpha_z + \beta_z)^2 + \right. \\ \frac{1}{2}\theta_{z1}\left(\frac{3}{2}\alpha_z + \beta_z\right) - \frac{1}{4}(\alpha_z + \beta_z + \gamma_z + 2(\theta_{1z} - \theta_{2z}))(2\alpha_z + \beta_z + 3\theta_{z1} - \theta_{z2}) + \\ \frac{1}{2}(\theta_{y1} - \theta_{y2})^2 + \theta_{y1}^2 + \frac{1}{4}\alpha_y^2 - \frac{1}{2}\theta_{y2}(\alpha_y + \beta_y) + \frac{1}{4}(\alpha_y + \beta_y)^2 + \\ \left. \frac{1}{2}\theta_{y1}\left(\frac{3}{2}\alpha_y + \beta_y\right) - \frac{1}{4}(\alpha_y + \beta_y + \gamma_y + 2(\theta_{y1} - \theta_{y2}))(2\alpha_y + \beta_y + 3\theta_{y1} - \theta_{y2}) \right\} \end{array} \right\} +$$

$$2(X_1 + X_2).$$

According to Equation (10), the effects of the deviations are equivalent to a change in the directions of the effective measurement axis in the x-y and x-z planes by $\eta_z$ and $\eta_y$, respectively, with $$\eta_z = \frac{1}{4}(\alpha_z + \beta_z + \gamma_z + 2(\theta_{z1} - \theta_{z2})), \tag{11}$$

$$\eta_y = \frac{1}{4}(\alpha_y + \beta_y + \gamma_y + 2(\theta_{y1} - \theta_{y2})), \tag{12}$$

and to change the effective scale or equivalent wavelength by a factor $\zeta$ where $$\zeta = 1 + \frac{1}{16}(\alpha_z + \beta_z + \gamma_z + 2(\theta_{z1} - \theta_{z2}))^2 + \tag{13}$$

$$\frac{1}{4}\left\{ \begin{array}{l} 2(\theta_{z1} - \theta_{z2})^2 + 4\theta_{z1}^2 + \alpha_z^2 - 2\theta_{z2}(\alpha_z + \beta_z) + \\ (\alpha_z + \beta_z)^2 + \theta_{z1}(6\alpha_z + 4\beta_z) \end{array} \right\} -$$

$$\frac{1}{8}(\alpha_z + \beta_z + \gamma_z + 2(\theta_{z1} - \theta_{z2}))(4\alpha_z + 2\beta_z + 6\theta_{z1} - 2\theta_{z2}) +$$

$$\frac{1}{16}(\alpha_y + \beta_y + \gamma_y + 2(\theta_{y1} - \theta_{y2}))^2 +$$

$$\frac{1}{4}\left\{ \begin{array}{l} 2(\theta_{y1} - \theta_{y2})^2 + 4\theta_{y1}^2 + \alpha_y^2 - 2\theta_{y2}(\alpha_y + \beta_y) + \\ (\alpha_y + \beta_y)^2 + \theta_{y1}(6\alpha_y + 4\beta_y) \end{array} \right\} -$$

$$\frac{1}{8}(\alpha_y + \beta_y + \gamma_y + 2(\theta_{y1} - \theta_{y2}))(4\alpha_y + 2\beta_y + 6\theta_{y1} - 2\theta_{y2})$$

Thus, to account for contributions to the optical path difference due to deviations of the input and/or measurement beam paths from a nominal path, Equation (2) can be re-expressed as $$\Phi = 2pkL\zeta[1 - (\theta_z + \eta_z)^2 - (\theta_y + \eta_y)^2] + 2k(X_1 + X_2) \tag{14}$$

where terms are retained up to quadratic order and the terms arising from the reference beam path have been omitted. The terms arising from the reference beam may be added as required according the described procedure.

The systematic effects of departures of surface 184F from a plane surface 184A on the direction of the measurement axis as represented by $\eta_z$ and $\eta_y$ given by Equations (11) and (12) are dependent on the approximate second order spatial derivative of the profile of surface 184F, i.e., $(\theta_{z1}-\theta_{z2})$ and $(\theta_{y1}-\theta_{y2})$. This is to be contrasted with the systematic effect of a rotation of mirror object 184 which depends on the first order spatial derivative or gradient of the surface 184A, e.g., $\theta_z$ and $\theta_y$. The lack of symmetry with respect to the two systematic effects is because changes in $\theta_z$ and $\theta_y$ represent rotations of mirror object 184 as a solid body while the rotation specified for example by $\theta_{z1}$ represents a local rotation of a portion of mirror object 184. The lack of symmetry with respect to the two systematic effects may also be understood as associated with the respective different points of rotation of mirror object 184, e.g., the point of rotation associated with $\theta_z$ and $\theta_y$ is at the intersection of the measurement axis and surface 184A and the point of local rotation associated with $\theta_{z1}$, for example, corresponds to the intersection of the path of first pass measurement beam 335A with surface 184F.

The systematic effects of the approximate second order spatial derivative of surface 184F can result in high precision specifications for the surface of mirror objects in certain end use applications. As an example, consider an application where the desired accuracy of a linear displacement measurement is 0.1 nm, the value of the measurement path L=0.7 m, $\xi$=1.1, and $\theta_z$=0.5 millirad. For a deformation of surface 184F with an amplitude a and a spatial wavelength $\Lambda$=1 cm, the subsequent specification on a is $$a \leq 0.2 \text{ nm} \tag{15}$$

or $a \leq \lambda/3000$ for $\lambda$=633 nm. The effects of spatial wavelengths greater than or of the order of the $1/e^2$ diameter of the measurement beams will not be eliminated by integration over the photosensitive area of detector 120. A general expression for the specification on the amplitude a in terms L, $\theta = (\theta_z^2 + \theta_y^2)^{1/2}$, a separation d between the first and second pass measurement beams 335A and 335B, $\xi$, and $\Lambda$ for an error of $\epsilon$ in a linear displacement is $$a \leq \left(\frac{\varepsilon}{4\pi\xi L\theta}\right)\left(\frac{\Lambda}{\sin(\pi d/\Lambda)}\right). \tag{16}$$

Note that while errors $\delta_z$ and $\delta_y$ may effect the magnitude of the heterodyne signal of signal 52 because these errors are related to the extent to which the measurement and reference beam components in the output beam overlap, the magnitude of the heterodyne signal alone may not be an accurate indication of beam path deviations. This is because although $\delta_z$ and $\delta_y$ may be substantially zero, other components of $\zeta$, $\eta_z$, and $\eta_y$, may still contribute to the optical path difference.

Deviations $\alpha_z$ and $\alpha_y$ are typically a function of the stability and alignment of source 115 and a respective beam system. These deviations can be monitored using an angular displacement interferometer. Details of angular displacement interferometers are disclosed, for example, in PCT Publication WO 00/66969 by Henry A. Hill and published Nov. 9, 2000, the contents of which is incorporated herein by reference, and in U.S. patent application Ser. No. 10/272,034 by Henry A. Hill, filed Oct. 15, 2002 and entitled "INTERFEROMETER FOR MEASURING CHANGES IN OPTICAL BEAM DIRECTIONS."

Deviations $\theta_{z1}$, $\theta_{z2}$, $\theta_{y1}$, $\theta_{y2}$, $\beta_z$, $\beta_y$, $\delta_z$, and $\delta_y$ depend on HSPMI 300 and measurement object 184. Due to the inhomogeneous nature of the defects giving rise to beam path deviations, deviations $\theta_{z1}$, $\theta_{z2}$, $\theta_{y1}$, $\theta_{y2}$, $\beta_z$, $\beta_y$, $\delta_z$, and $\delta_y$ can vary for different nominal paths. Moreover, deviations $\theta_{z1}$, $\theta_{z2}$, $\theta_{y1}$, $\theta_{y2}$, $\beta_z$, $\beta_y$, $\delta_z$, and $\delta_y$ can vary as a function of the propagation direction of the input beam. Accordingly, deviations $\theta_{z1}$, $\theta_{z2}$, $\theta_{y1}$, $\theta_{y2}$, $\beta_z$, $\beta_y$, $\delta_z$, and $\delta_y$ can be parameterized as a function of measurement object displacement relative to the interferometer, the angular orientation of the measurement object, and the input beam propagation direction.

In general, in applications where these deviations typically change slowly with time, such as, for example, in many precision metrology applications, deviations can be determined prior to deployment of the interferometer in its end use application. This error correction data can be stored in a representation, such as a lookup table, which is accessed when the interference phase data captured using system 100 is to be analyzed. In some embodiments, the representation relating the observable parameters to beam deviations can be in the form of a functional representation (e.g., one or more algebraic functions), and the beam deviations can be determined from the parameters using the functions.

Beam deviation angles $\theta_{z1}$, $\theta_{z2}$, $\theta_{y1}$, $\theta_{y2}$, $\beta_z$, $\beta_y$, $\delta_z$, and $\delta_y$ are examples of error correction terms that correspond directly to the physical direction of beams in the interferometry system. More generally, however, error correction terms can include more abstract expressions as well. In some embodiments, for example, error correction terms can be parameters that are readily observable, but do not bear a direct correspondence to a physical beam direction.

In certain embodiments, measurement object displacement can be determined using an iterative process. Where the correction data is parameterized by interferometrically determined parameters (e.g., measurement object displacement and/or angular orientation), the system can iterate the parameter and error correction term determination until the system converges on a value for the parameter. For example, where the error correction term data is parameterized by measurement object displacement, the system can make an initial determination for the displacement from the measured phase using Equation (2). Using the initial displacement value, the system then determines the error correction terms from the representation. Using this data, the system recalculates the displacement using Equation (14) to provide a once-corrected displacement value. The system iterates this procedure by re-determining the error correction terms based on the once-corrected displacement value. This process can be repeated until the corrected displacement suitably converges.

Data relating the observable parameters to deviation angles can be characterized in a calibration procedure prior to installing the interferometer and other components in their end-use application such as described in U.S. application Ser. No. 10/366,587 entitled "APPARATUS AND METHOD FOR QUANTIFYING AND COMPENSATING NON-CYCLIC NON-LINEARITY IN INTERFEROMETRY SYSTEMS" to Henry A. Hill, the contents of which are herein incorporated in their entirety by reference. In some embodiments, for example, deviations $\beta_z$, $\beta_y$, $\delta_z$, and $\delta_y$ can be measured by splitting off a portion of the appropriate beam with a non-polarizing beam splitter, and monitoring the beam direction while scanning the measurement object displacement, orientation angle, and/or direction of the input beam. For example, in order to determine $\beta_z$ or $\beta_y$, a beam-splitter can be positioned in both the first pass and second pass path of the measurement beam to the measurement object. The measurement beam direction is then tracked for each pass by monitoring the direction of the beam directed out of the measurement beam path by the beam-splitter while the system scans the measurement object displacement, orientation angle, and/or input beam direction of the interferometer.

Non-zero values for the deviations $\theta_{z1}$, $\theta_{z2}$, $\theta_{y1}$, $\theta_{y2}$, $\beta_z$, $\beta_y$, $\delta_z$, and $\delta_y$ can arise from imperfections in the interferometer and/or plane mirror measurement object. For example, non-zero values of $\theta_{z1}$, $\theta_{z2}$, $\theta_{y1}$, and/or $\theta_{y2}$ may be caused by surface imperfections of the plane mirror measurement object, and can cause a deviation of the first and/or second pass measurement beam from the nominal path. Additionally, imperfections in the optical components making up the interferometer can contribute to $\beta_z$ and/or $\beta_y$, either prior to the measurement beam's first pass to the measurement object or between the beam's first and second pass the measurement object.

In certain embodiments, local surface imperfections of a plane mirror measurement object can be measured by monitoring the beam direction of a beam reflected from the plane mirror measurement object. Notably such techniques can provide the local slope information of the plane mirror measurement object with resolution on the order of the diameter of the reflected beam. Beam directions can be monitored interferometrically or non-interferometrically. Examples of suitable interferometers for monitoring beam directions include angle interferometers, such as the angle interferometer described above, and Hartmann-Shack interferometers.

A Hartmann-Shack interferometer utilizes a lenslet array, which is placed in the path of a pair of overlapping beams to be measured. A detector is positioned at the focal plane of the lenslet array. When the beams are coincident and their paths are parallel to the optical axes of the lenslets, the beams are focused to an array of spots also coincident with the lenslet optical axes. However, deviations of one of the beam's direction cause it to be focused to a different location from those corresponding to the undeviated beam. The detector can track these deviations, and the data can be used to calculate the beam propagation direction based on the properties and location of the lenslet array. Use of Hartmann-Shack interferometers (also termed Hartmann-Shack sensors) in other applications is disclosed, for example, by Liang, J and co-workers in "Objective measurement of wave aberrations of the human eye with the use of a Hartmann-Shack wave-front sensor," J. Opt. Soc. Am. (A), 11, 1949-57 (1994), by J. Liang and D. R. Williams in "Aberrations and retinal image quality of the normal human eye," J. Opt. Soc. Am. (A), 14, 2873-83 (1997), and P. M. Prieto and co-workers in "Analysis of the performance of the Hartmann-Shack sensor in the human eye," J. Opt. Soc. Am. (A), 17, 1388-98 (2000).

Non-interferometric methods of monitoring beam direction include, for example, tracking the beam direction using a pixilated detector array (e.g., a CCD or CMOS camera). As the beam direction changes, it impinges on different detector elements in the array. By tracking the location of the beam on the array while scanning measurement object displacement, orientation angle, and input beam direction, the system can determine variations of the beam direction as a function of the scanned parameters. When using a pixilated detector array, the optical path of the tracked beam to the detector array should be sufficiently long to provide sufficient angular resolution.

While the aforementioned error correction terms can be monitored directly using techniques disclosed herein, imperfections in components of the interferometry system (including surface imperfections of the plane mirror measurement object) can also be characterized in other ways. For example, imperfections in the reflecting surface of the plane mirror measurement object (e.g., variations in the mirror's surface topography) can be accounted for by measuring the mirror's figure, which is a measure of a mirror's surface topography. The figure of each measurement object can be characterized, for example, using a Fizeau interferometer. The figure of the portions of the measurement objects may also be determined by techniques such as described in cited commonly owned U.S. patent application Ser. No. 09/853,114 entitled "IN-SITU STAGE MIRROR CHARACTERIZATION," filed May 10, 2001, U.S. patent application Ser. No. 10/217,531, also entitled "IN-SITU MIRROR CHARACTERIZATION," filed on Aug. 13, 2002, International Patent Application No. PCT/US02/25652 entitled "IN-SITU STAGE MIRROR CHARACTERIZATION" and U.S. patent application Ser. No. 10/406,749, entitled "METHOD AND APPARATUS FOR STAGE MIRROR MAPPING," filed Apr. 3, 2003, which claims priority to Provisional Patent Application 60/371,172 filed on Apr. 9, 2002, with the same title. These applications name Henry Allen Hill as inventor, and the entire contents of each is hereby incorporated by reference.

In embodiments where imperfections in optical components are measured directly, the error correction terms can be determined from the imperfections using known relationships between the imperfections and beam paths. For example, ray tracing tools can be used to provide beam anticipated beam paths through an interferometer based on, e.g., empirical data related to optical surfaces and bulk imperfections in system components.

During error calibration and/or during use of system 100, $\theta_z$ and $\theta_y$ can be monitored interferometrically or by other methods. Interferometric methods for monitoring an orientation angle of a plane mirror measurement object are well established in the art. One way to interferometrically monitor the angular orientation of a plane mirror measurement object is to use two displacement measuring interferometers (e.g., two HSPMIs). Where the distance between the interferometer measurement axes is known, the interferometers can be used to provide the measurement object orientation within a first plane defined by the measurement axes. Angular orientation of the measurement object in a plane perpendicular to the first plane can be determined by using a third displacement measuring interferometer, wherein the third displacement measuring interferometer is positioned so that its measurement axis and the measurement axis of one of the other interferometers define a plane perpendicular to the first plane.

Geometric Error in Determination of an Off-Axis Location

The formalism represented supra accounts for certain geometric errors and is used to provide insight into geometric errors. For example, with the formalism presented supra, the interference phase $\Phi$ for a double-pass plane mirror interferometer, such as HSPMI 300, including the geometric effects of rotation of both the reference and measurement object mirrors by $\theta_M$ and $\theta_R$, respectively, can be expressed as $$\Phi = 4n_a kL + 4k[L_M(\cos^2\theta_M - 1) - L_R(\cos^2\theta_R - 1)] + 2k(X_1 + X_2) = 2pn_a kL - 2pk[L_M(\theta_{P,M}^2 + \theta_{Y,M}^2) - L_R(\theta_{P,R}^2 + \theta_{Y,R}^2)] + 2k(X_1 + X_2) + \quad (17)$$

where L is the relative one way path length difference in air between the measurement and reference beam paths at $\theta_M = 0$ and $\theta_R = 0$; $n_a$ is the average refractive index of the air corresponding to the path length difference L; $L_M$ and $L_R$ are the effective one way path lengths between the nodal point of the retroreflector in the interferometer and the measurement and reference object mirrors, respectively, and correspond to $-\eta_y$ and $-\eta_z$, respectively, of equation (14), at $\theta_M = 0$ and $\theta_R = 0$; $\theta_{P,M}$ and $\theta_{Y,M}$ are the corresponding pitch and yaw components of $\theta_M$ respectively; and $\theta_{P,R}$ and $\theta_{Y,R}$ are the pitch and yaw components of $\theta_R$ respectively.

Equation (17) expressed in this manner shows that the largest contribution to the phase, the first term, is dependent on the relative path length difference between the reference and measurement object mirrors. Although the second term requires the absolute path lengths for the measurement and reference object mirrors, respectively, the fact that the beams are typically close to being normally incident on the respective mirrors (e.g., $\theta_M$, $\theta_R$ can be less than or on the order of about $10^{-3}$ radians) means that measurement tolerances for the path lengths $L_M$ and $L_R$ may be significantly larger (e.g., on the order of or greater than about $10^6$) than the acceptable path length measurement error for L.

In the formalism presented supra, the effective one way path lengths $L_M$ and $L_R$ are given by the formulae:

$$L_M = n_a l_M + \frac{n_a^2 l_{I,M}}{n_I}, \quad (18)$$

$$L_R = n_a l_R + \frac{n_a^2 l_{I,R}}{n_I}$$

where $l_M$ and $l_R$ are the one way physical path lengths of the measurement and reference paths in air for $\theta_M = 0$ and $\theta_R = 0$, $n_I$ is the refractive index of the glass portion of an interferometer comprising a single medium relative to vacuum, and $l_{I,M}$ and $l_{I,R}$ are the one way physical path lengths of the measurement and reference beams, respectively, in the glass portion of the interferometer for $\theta_M = 0$ and $\theta_R = 0$. The lengths $l_{I,M}$ and $l_{I,R}$ correspond to the respective physical path lengths of a beams at $\theta_M = 0$ and $\theta_R = 0$, respectively, measured from the apex of the retroreflector.

Figure 5:
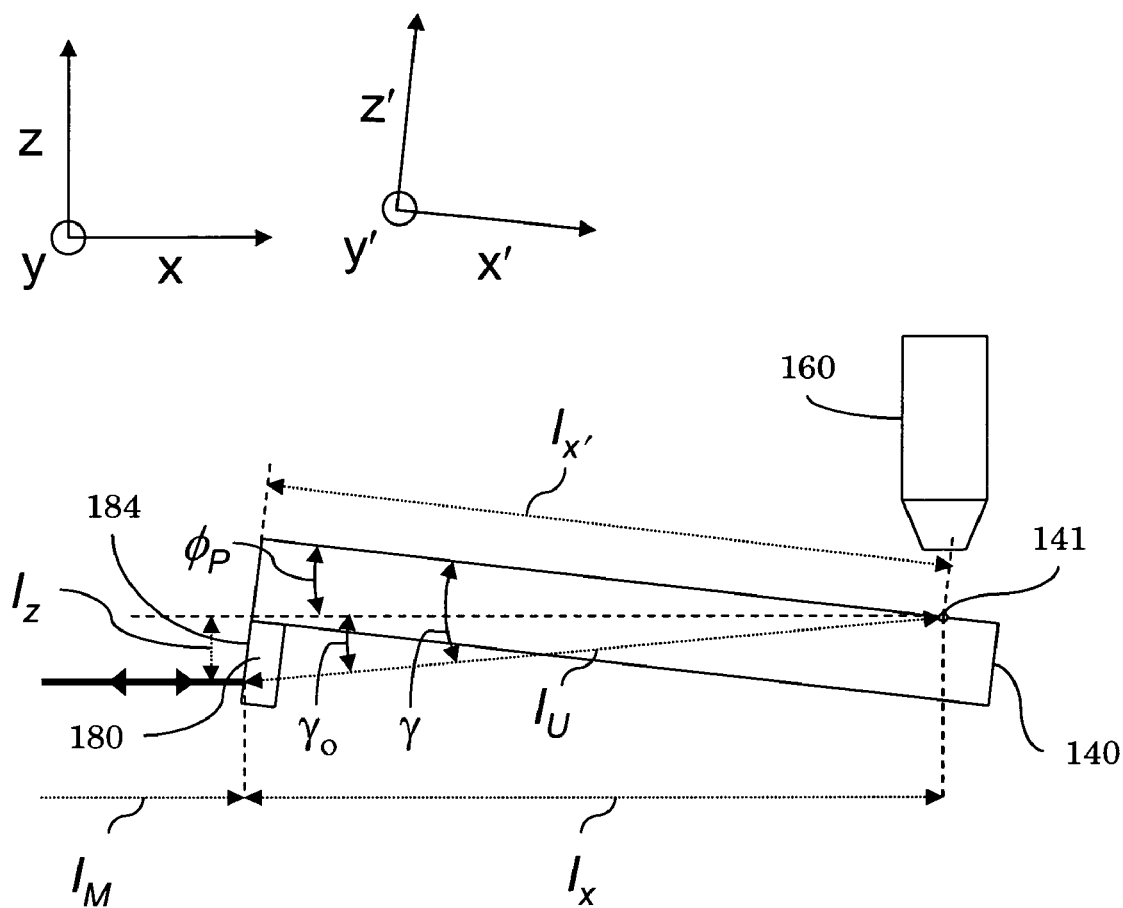
FIG. 5 is a cross-sectional view of a tilted stage in the lithography tool shown in FIGS. 1 and 2.

Referring to FIG. 5, when considering the position of a location 141 on stage 140 remote from measurement object mirror 180, it is necessary to consider the geometric error introduced by Abbé offsets. An Abbé offset for an interferometer is defined as a displacement of a reference point from the measurement axis of the interferometer.

In general, Abbé offset effects come into play when the stage is positioned such that a reference mark is centered at a reference point determined by an off-axis alignment scope. Abbé offset effects can influence $l_x$, the displacement of the reference mark along the measurement axis from the measurement object mirror. Abbé offset effects can also influence $l_M$, the measurement beam path length in air along the measurement axis. In this discussion that follows, the functional dependence of $l_x$, $l_M$ on the Abbé offsets.

To derive an expression of how $l_x$ is dependent on the Abbé offsets, consider two coordinate systems, both of which whose origins are located at the reference point in the focal plane of scope 160. The first coordinate system denoted x, y, and z is oriented with respect to the measurement beam and corresponds to the co-ordinate system introduced with respect to the description of system 100 supra, while the second, denoted x', y', and z', is oriented with respect to the wafer mounted on the stage. The second coordinate system is oriented with respect to the first such that the x' axis is normal to the y axis, and the y' axis is normal to the x axis. The wafer yaw and pitch angles $\phi_y, \phi_p$ are the angles between the y and y' axes and the x and x' axes, respectively. The point of intersection of the measurement object mirror and the measurement axis is at position $(-l_x, -l_y, -l_z)$ in the coordinate system oriented with respect to the measurement beam, and at position $(-l_{x'}, -l_{y'}, -l_{z'})$ in the coordinate system oriented with respect to the artifact wafer. With this notation, $l_x$ is the displacement of reference mark 141 when the reference mark is aligned with the scope 160 and $l_y, l_z$ are the Abbé offsets in the y and z directions respectively.

FIG. 5 illustrates a cross-section of the geometry of lithography tool 100 in the x-z plane showing the effect of stage pitch. In FIG. 5, mirror 180 is depicted as being attached to the underside of stage 140. However, the formalism that follows applies to various arrangements of the measurement object on the stage, such as, for example, arrangements in which the stage is attached to the top-side, underside or edge of stage 140. For the purpose of illustration, the variables $l_U, \gamma, \gamma_o$ are defined representing the distance between the reference point of scope 160 and the point of intersection of the measurement axis and stage mirror surface 184 assuming no Abbé offset in the y direction, the angle between the said line and the wafer, and the angle between the said line and the measurement axis, respectively.

The value of $l_x$ can be expressed as follows:

$$l_x = l_U \cos \gamma_o \quad (19)$$

$$l_U = l_{x'} \sec \gamma = l_{x'} \sec(\gamma_o + \phi_P) \quad (20)$$

Performing a Taylor expansion about $\gamma_o$ we get:

$$\sec(\gamma_o + \phi_P) = \sec\gamma_o + \sec\gamma_o \cdot \tan\gamma_o \cdot \phi_P + \sec\gamma_o(1 + 2\tan^2\gamma_o)\frac{\phi_P^2}{2!}\ldots \quad (21)$$
$$= \sec\gamma_o \left[1 + \tan\gamma_o \cdot \phi_P + (1 + 2\tan^2\gamma_o)\frac{\phi_P^2}{2!}\ldots\right]$$

Substituting equation (21) into equation (20) and in turn into equation (19) we get:

$$l_x = l_{x'}\left[1 + \tan\gamma_o \cdot \phi_P + (1 + 2\tan^2\gamma_o)\frac{\phi_P^2}{2!}\ldots\right] \quad (22)$$

From FIG. 5, it is apparent that:

$$l_z = l_{x'} \tan \gamma_o \quad (23)$$

since $l_{x'}$ is a constant independent of $\phi_P$ for a given artifact. Substituting equation (23) into equation (22) yields:

$$l_x = l_{x'}\left(1 + \frac{\phi_P^2}{2}\right) + l_z\phi_P + \frac{l_z^2\phi_P^2}{l_{x'}} \quad (24)$$

Equation (24) was derived considering only stage pitch. Considering both pitch and yaw stage motions yields:

$$l_x = l_{x'}\left(1 + \frac{\phi_P^2}{2} + \frac{\phi_Y^2}{2}\right) + l_z\phi_P + l_y\phi_Y + \frac{(l_z^2\phi_P^2 + l_y^2\phi_Y^2)}{l_{x'}} \quad (25)$$

Thus, Abbé offset effects may be accounted for when the stage yaw and pitch $\phi_Y, \phi_P$, Abbé offsets $l_y, l_z$, and the displacement in the wafer coordinate system $l_{x'}$ are known. As a result of the choice of the unprimed and primed coordinate systems shown in FIG. 5, $\phi_P = \theta_{P,M} - \Delta\theta_{P,M}$ and $\phi_Y = \theta_{Y,M} - \Delta\theta_{Y,M}$, where $\Delta\theta_{P,M}, \Delta\theta_{Y,M}$ are geometric error correction factors for pitch and yaw, respectively. These are discussed in more detail infra. In this case, equation (25) can be expressed as follows:

$$l_x = l_{x'}\left[1 + (\theta_{P,M} - \Delta\theta_{P,M})^2\left(\frac{1}{2} + \frac{l_z^2}{l_{x'}^2}\right) + (\theta_{Y,M} - \Delta\theta_{Y,M})^2\left(\frac{1}{2} + \frac{l_y^2}{l_{x'}^2}\right)\right] + \quad (26)$$
$$l_z(\theta_{P,M} - \Delta\theta_{P,M}) + l_y(\theta_{Y,M} - \Delta\theta_{Y,M})$$

Note that as compared to equation (17), equation (26) includes a factor of 2 and terms that are inversely proportional to $l_{x'}$.

The accuracy to which $l_{x'}$ need be known for a reference mark may be reduced from that required for the accuracy of measured values of L because of the presence of the second order factors $(\theta_{P,M} - \Delta\theta_{P,M})^2$ and $(\theta_{Y,M} - \Delta\theta_{Y,M})^2$.

Due to the fact that the distance from the interferometer to the OAS is constant, it becomes obvious upon inspection of FIG. 5 that $$l_M + l_x = l_{j,M} + l_{x'} \quad (27)$$

where $l_{j,M}$ is a constant representing the measurement beam path length in air along the measurement axis for the $j^{th}$ reference mark for $\phi_P = \phi_Y = 0$ and $l_{x'}$ is the corresponding length for the $j^{th}$ reference mark. The beam path lengths for each reference mark can be expressed in terms of a single measurement of the path length in air when $\phi_P = \phi_Y = 0$ the interferometer is at the initialization point $l_{0,M}$ as follows:

$$l_{j,M} = l_{0,M} - l_{x'} \quad (28)$$

Substituting equation (28) into equation (27) we get a simplified form for $l_M$:

$$l_M = l_{0,M} - l_x \quad (29)$$

Substituting equation (26) into equation (29) becomes:

$$l_M = l_{0,M} - \quad (30)$$
$$l_{x'}\left[1 + (\theta_{P,M} - \Delta\theta_{P,M})^2\left(\frac{1}{2} + \frac{l_z^2}{l_{x'}^2}\right) + (\theta_{Y,M} - \Delta\theta_{Y,M})^2\left(\frac{1}{2} + \frac{l_y^2}{l_{x'}^2}\right)\right] +$$
$$l_z(\theta_{P,M} - \Delta\theta_{P,M}) + l_y(\theta_{Y,M} - \Delta\theta_{Y,M})$$

As discussed supra, geometric errors can also be induced by factors other than object mirror/stage rotation. For example, geometric errors can be cause by changes in the direction of the input beam to the interferometer, non-ideal optics that affect the directional relationship between the return first pass reference and measurement beams and the first half of the second pass reference and measurement beams, respectively, and/or other effects of errors in the interferometer.

In the present formalism, equation (17) can be modified as follows to account for these other geometric errors:

$$\Phi = 4n_a k \zeta L - 4k \left\{ \begin{array}{l} L_M [(\theta_{P,M} - \Delta\theta_{P,M})^2 + (\theta_{Y,M} - \Delta\theta_{Y,M})^2] - \\ L_R [(\theta_{P,R} - \Delta\theta_{P,R})^2 + (\theta_{Y,R} - \Delta\theta_{Y,R})^2] \end{array} \right\} + \quad (31)$$

$$2k(X_1 + X_2) + \ldots$$

where $\zeta$ is a scale factor and the terms $\Delta\theta_{P,M}$, $\Delta\theta_{Y,M}$, $\Delta\theta_{P,R}$, and $\Delta\theta_{Y,R}$ represent corrections in the respective pitch and yaw angles.

In cases where the reference path is very stable, such as in an HSPMI, the last term of equation (31) can be approximated as a non-zero phase offset that may drift over time. In some embodiments, the reference mirror may intentionally be tilted in a way to suppress half-harmonic cyclic errors. In such cases, the phase offset drift may be significant and may necessitate scheduling more frequent correction factor recalibrations The scale factor $\zeta$ is a function of the beam deviations in the interferometer excluding the measurement and reference object mirrors. The correction terms for the pitch and yaw angles of the object mirror $\Delta\theta_{P,M}, \Delta\theta_{Y,M}$ may be expressed as being composed of two terms:

$$\Delta\theta_{P,M} = \Delta\theta'_{P,M} + \Delta\theta''_{P,M},$$

$$\Delta\theta_{Y,M} = \Delta\theta'_{Y,M} + \Delta\theta''_{Y,M}. \quad (32)$$

The first terms, $\Delta\theta'_{P,M}, \Delta\theta'_{Y,M}$, of these equations are a function of beam deviations due to imperfections in the interferometer or source and the second terms, $\Delta\theta''_{Y,M}, \Delta\theta''_{Y,M}$, on the other hand, are governed by the surface figure of the object mirror. For the case of an interferometer with a stable reference beam path such as an HSPMI, the phase measured by the interferometer can be expressed after initialization as:

$$\Phi - \Phi_0 = 4n_a k \zeta (L - L_0) - 4k L_M[(\theta_{P,M} - \Delta\theta_{P,M})^2 + (\theta_{Y,M} - \Delta\theta_{Y,M})^2] + 2k(X_1 + X_2) - 2k(X_1 + X_2)_0 \quad (33)$$

where the phase upon initialization $\Phi_0$ is selected to be a nominal value, such as 0, $L_0$ is an effective path length difference between the measurement and reference beams along the measurement axis when the stage is at the initialization point, and $(X_1+X_2)_0$ is the value of $(X_1+X_2)$ at the initialization point. The value of $L_0$ is not necessarily determined or required (except possibly, for example, in determination of a value of $L_M$), but is included in equation (33) for completeness.

Data for the error correction terms can be acquired by monitoring variations in the interference phase while keeping a reference mark aligned with the alignment scope while varying the stage pitch and/or yaw.

Equation (17) shows that for double pass interferometers the geometric error is generated by a term proportional to a cosine squared of the stage orientation (e.g., pitch and/or yaw angles). According to Equations (19) and (20), the geometric errors introduced by the displacement of a reference mark from the measurement object mirror measurement mirror and from the axis of an interferometer is generated by a term proportional to the first power of the cosine of the stage orientation angle. This difference can be exploited to determine geometric error correction parameters and factors and the Abbé offsets. The mirror position and Abbé offset geometric errors associated with the artifact position are both taken into account when equation (33) is described in terms of the total distance $L-L_0+l_x$ along the measurement axis from the initialization point to the artifact. For a given artifact $L-L_0+l_x$ and $L_M+l_x$ are fixed because the distance between the nodal point of the interferometer and the reference point of the alignment scope is fixed. Rearranging factors in equation (33) and using the expression for $l_x$ in equation (26) yields:

$$\frac{\Phi - \Phi_0}{4n_a k \zeta} = (L - L_0 + l_x) - \frac{L_M}{\zeta n_a}[(\theta_{P,M} - \Delta\theta_{P,M})^2 + (\theta_{Y,M} - \Delta\theta_{Y,M})^2] - \quad (34)$$

$$l_{x'}\left[1 + (\theta_{P,M} - \Delta\theta_{P,M})^2\left(\frac{1}{2} + \frac{l_z^2}{l_{x'}^2}\right) + (\theta_{Y,M} - \Delta\theta_{Y,M})^2\left(\frac{1}{2} + \frac{l_y^2}{l_{x'}^2}\right)\right] -$$

$$l_z(\theta_{P,M} - \Delta\theta_{P,M}) - l_y(\theta_{Y,M} - \Delta\theta_{Y,M}) + \frac{(X_1 + X_2)}{2n_a\varsigma} - \frac{(X_1 + X_2)_0}{2n_a\varsigma}$$

Substituting equation (18) into equation (34) yields:

$$\frac{\Phi - \Phi_0}{4n_a k \zeta} = (L - L_0 + l_x) - \quad (35)$$

$$\left(\frac{l_M}{\zeta} + \frac{n_a}{n_l}\frac{l_{l,M}}{\zeta}\right)[(\theta_{P,M} - \Delta\theta_{P,M})^2 + (\theta_{Y,M} - \Delta\theta_{Y,M})^2] -$$

$$l_{x'}\left[1 + (\theta_{P,M} - \Delta\theta_{P,M})^2\left(\frac{1}{2} + \frac{l_z^2}{l_{x'}^2}\right) + (\theta_{Y,M} - \Delta\theta_{Y,M})^2\left(\frac{1}{2} + \frac{l_y^2}{l_{x'}^2}\right)\right] -$$

$$l_z(\theta_{P,M} - \Delta\theta_{P,M}) - l_y(\theta_{Y,M} - \Delta\theta_{Y,M}) + \frac{(X_1 + X_2)}{2n_a\varsigma} - \frac{(X_1 + X_2)_0}{2n_a\varsigma}$$

With the substitution of the expression for $l_M$ given by Equation (30) into Equation (35) and neglecting Abbé offset terms that are cubic or higher order in pitch and yaw angular displacements and neglecting all other terms that are fourth order or higher in pitch and yaw angular displacements, equation (35) is written as:

$$\frac{\Phi - \Phi_0}{4n_a k \zeta} = (L - L_0 + l_x) - \quad (36)$$

$$\left(\frac{l_{0,M} - l_{x'}}{\zeta} + \frac{n_a}{n_l}\frac{l_{l,M}}{\zeta}\right)[(\theta_{P,M} - \Delta\theta_{P,M})^2 + (\theta_{Y,M} - \Delta\theta_{Y,M})^2] -$$

$$l_{x'}\left[1 + (\theta_{P,M} - \Delta\theta_{P,M})^2\left(\frac{1}{2} + \frac{l_z^2}{l_{x'}^2}\right) + (\theta_{Y,M} - \Delta\theta_{Y,M})^2\left(\frac{1}{2} + \frac{l_y^2}{l_{x'}^2}\right)\right] -$$

$$l_z(\theta_{P,M} - \Delta\theta_{P,M}) - l_y(\theta_{Y,M} - \Delta\theta_{Y,M}) + \frac{(X_1 + X_2)}{2n_a\varsigma} - \frac{(X_1 + X_2)_0}{2n_a\varsigma}$$

The first term in parentheses on the right hand side of equation (36) is constant for a specific reference mark. The second term on the right hand side of equation (36) corresponds to the geometric error due to measurement object mirror rotation. The third and fourth terms on the right hand side of equation (36) are due to the geometrical error resulting from the Abbé offsets.

Given the fact that it is a reasonable approximation to assume $\zeta=1$ for the geometric correction terms and that $l_{0,M}$=const., equation (36) can be rewritten as:

$$\frac{\Phi - \Phi_0}{4n_a k \zeta} = (L - L_0 + l_x) - \tag{37}$$

$$\left(l_{0,M} + \frac{n_a}{n_I} l_{I,M}\right)[(\theta_{P,M} - \Delta\theta_{P,M})^2 + (\theta_{Y,M} - \Delta\theta_{Y,M})^2] -$$

$$l_{x'}\left[1 + (\theta_{P,M} - \Delta\theta_{P,M})^2\left(\frac{l_z^2}{l_{x'}^2} - \frac{1}{2}\right) + (\theta_{Y,M} - \Delta\theta_{Y,M})^2\left(\frac{l_y^2}{l_{x'}^2} - \frac{1}{2}\right)\right] -$$

$$l_z(\theta_{P,M} - \Delta\theta_{P,M}) - l_y(\theta_{Y,M} - \Delta\theta_{Y,M}) + \frac{(X_1 + X_2)}{2n_a\varsigma} - \frac{(X_1 + X_2)_0}{2n_a\varsigma}$$

In a procedure for determining the angular geometric correction terms $\Delta\theta_{P,M}, \Delta\theta_{Y,M}$, phase variations are monitored while varying $\theta_{P,M}$ or $\theta_{Y,M}$ (for determining $\Delta\theta_{P,M}$ and $\Delta\theta_{Y,M}$, respectively) while keep a reference mark in the field of view of the alignment scope (or at some other common position). This is repeated for at least two different reference marks. The effects of the Abbé offsets are removed by subtracting displacement measurements made for the two different reference marks. After subtraction and rearranging terms, the difference written in the form of equation (37) becomes:

$$\frac{\Phi_2 - \Phi_1}{4n_a k \zeta} = (L_2 - L_1 + l_{x,2} - l_{x,1}) - (l_{x',2} - l_{x',1}) - \tag{38}$$

$$(l_{M,2} - l_{M,1} + l_{x',2} - l_{x',1})[(\theta_{P,M} - \Delta\theta_{P,M})^2 + (\theta_{Y,M} - \Delta\theta_{Y,M})^2] -$$

$$\left\{ (\theta_{P,M} - \Delta\theta_{P,M})^2 \left[ \frac{l_z^2}{l_{x',2}} - \frac{l_z^2}{l_{x',1}} - \frac{(l_{x',2} - l_{x',1})}{2} \right] + \right.$$
$$\left. (\theta_{Y,M} - \Delta\theta_{Y,M})^2 \left[ \frac{l_y^2}{l_{x',2}} - \frac{l_y^2}{l_{x',1}} - \frac{(l_{x',2} - l_{x',1})}{2} \right] \right\}$$

where the $(X_1+X_2)/2n_a\zeta$ and $(X_1+X_2)_0/2n_a\zeta$ terms cancel out.

Thus, the angular geometric correction terms $\Delta\theta_{P,M}, \Delta\theta_{Y,M}$ can be determined by making fits to the measured differences in phase as a function of $\theta_{P,M}$ holding $\theta_{Y,M}$ constant, and phase as a function of $\theta_{Y,M}$ holding $\theta_{P,M}$ constant, respectively.

Once the angular geometric correction terms are known, they can be used in analysis of data to determine the Abbé offsets $l_z, l_y$. The angular geometric correction terms are substituted in equation (36). Plots of phase as a function of the geometrically corrected pitch $\theta_{P,M} - \Delta\theta_{P,M}$ holding yaw $\theta_{Y,M}$ constant, and geometrically corrected yaw $\theta_{Y,M} - \Delta\theta_{Y,M}$ holding pitch $\theta_{P,M}$ constant can be fit to second order polynomials:

$$\Phi - \Phi_0 = c_{0,P} + c_{1,P}(\theta_{P,M} - \Delta\theta_{P,M}) + c_{2,P}(\theta_{P,M} - \Delta\theta_{P,M})^2$$

$$\Phi - \Phi_0 = c_{0,Y} + c_{1,Y}(\theta_{P,M} - \Delta\theta_{P,M}) + c_{2,Y}(\theta_{P,M} - \Delta\theta_{P,M})^2 \tag{39}$$

The linear coefficients $c_{1,P}, c_{1,Y}$ determined from the fits of these plots correspond to the Abbé offsets $l_z, l_y$, respectively.

The quadratic coefficients $c_{2,P}, c_{2,Y}$ determined from the fits of these plots establish a relationship between $l_{0,M}$ and $l_{x'}$ for each reference mark. Gathering the quadratic terms of equation (36) provides analytical expressions for the quadratic coefficients of equation (39):

$$c_{2,P} = -\left(\frac{l_z^2}{l_{x'}} + \frac{l_{x'}}{2} + \frac{l_{0,M} - l_{x'}}{\zeta} + \frac{n_a}{n_I}\frac{l_{I,M}}{\zeta}\right) \tag{40}$$

-continued
$$c_{2,Y} = -\left(\frac{l_y^2}{l_{x'}} + \frac{l_{x'}}{2} + \frac{l_{0,M} - l_{x'}}{\zeta} + \frac{n_a}{n_I}\frac{l_{I,M}}{\zeta}\right)$$

The coefficients $n_a, l_{I,M}$ are measured and $n_I$ is found in literature, $\zeta$ is assumed to be unity, and may be close to unity in successive iterations. The user has the choice of measuring either $l_{0,M}$ or $l_{x'}$ for a given reference mark, and using either or both of equations (40) to determine the remaining unmeasured constant. Due to the fact $l_{0,M}$ and $l_{x'}$ are quadratic coefficients and the geometrically corrected angles are typically small, the measurement of $l_{0,M}$ or $l_{x'}$ only has to be made to relatively low accuracy (e.g., to an accuracy of ~$10^{-4}$ m). The relatively low accuracy required for $l_{0,M}$ and $l_{x'}$ allows a user to measure the quantities by non-interferometric techniques, such as using a vernier caliper.

Once the interferometer readings have been corrected for angular geometric error, the geometric error scale factor $\zeta$ can be determined. This factor is typically very close to unity. Initially, the scale factor is assumed to be unity for all interferometers. The distance between two widely spaced reference marks can be measured with an interferometer that is already corrected for angular geometric errors. Interferometers with effectively parallel measurement axes may have slightly different readings between the marks. A scale factor for each interferometer is then selected so that all readings match that of the readings made using the already-corrected interferometer.

The user has the option to iterate, repeat the geometric error correction coefficient determination employing these revised scaling factor values to get more accurate determinations of $\Delta\theta_{P,M}, \Delta\theta_{Y,M}, l_y, l_z$. Due to the fact that $\zeta$ should be so close to unity, the values should converge very rapidly.

Non-Linear Error Correction

In addition to geometric errors, interferometers may also suffer from non-linear errors which arise from relative changes between the measurement and reference beam wavefronts of the mixed output beam of an interferometer that are a direct consequence of changes in the position and/or angular orientation of the measurement and/or reference object mirrors. Non-linear errors may also result from similar sources that give rise to geometric errors. For example, the relative changes in wavefronts may arise when either the reference and/or measurement beams encounter inhomogeneities in interferometer optics, surface figure errors of mirror surfaces, retroreflector sector boundaries, interferometer boundaries, laser beam wavefront errors, and/or wavefront curvature generated by diffraction effects.

The primary source of the non-linear error is a variation in the phase of the electrical interference signal as one beam of the mixed output beam of the interferometer is sheared with respect to the other. An example of this is when a measurement beam is sheared with respect to a reference beam. A secondary source of the non-linear error is a variation in the phase of the electrical interference signal as one beam of the mixed output beam changes without any beam shear. For example, this can occur when a relative path length difference between a measurement beam and a reference beam changes without any shear. Thus, non-linear error is dependent on both beam shear between the measurement and reference beams of the mixed output beam and a change in measurement and/or reference beam path lengths.

Although beam shear is not easily measured directly in an interferometer mounted in a lithography tool, geometrically corrected pitch and yaw coordinates can be measured in a relatively straight forward manner. For small angles, the beam shear in each of the two directions corresponds to the effective path lengths the measurement and reference beams multiplied by the appropriate geometrically corrected angle coordinates (e.g., the pitch angle and yaw angle). Therefore, the non-linear correction can be expressed as a function of effective path length of a measurement beam, geometrically corrected yaw, and geometrically corrected pitch. For cases where there are corresponding changes in the reference beam paths, similar procedures described herein for the measurement beam path can be used to correct for the corresponding non-linear errors.

A non-linear error correction function may be determined by taking phase measurements when the position of a reference mark is detected by an off-axis optical alignment scope. Expressing the interference phase $\Phi$ as $$\Phi = 4kn_a \left\{ \zeta L - \left( l_M + l_{I,M} \frac{n_a}{n_I} \right) [(\theta_{Y,M} - \Delta\theta_{Y,M})^2 + (\theta_{P,M} - \Delta\theta_{P,M})^2] \right\} + \quad (41)$$
$$2k(X_1 + X_2) + \Phi_N$$

where L is the relative position of the measurement object measured along the measurement axis; p is the number of passes of the measurement and reference beams to respective measurement and reference objects; $n_a$ and $n_I$ are the index of refractions of the air and glass, respectively; k is the wavenumber; $l_M$ and $l_{I,M}$ are the components of the effective measurement path length in air and glass, respectively; $\theta_{Y,M}$ and $\theta_{P,M}$ are the measurement object mirror yaw and pitch angular coordinates, respectively, corrected for non-linear errors; $\zeta$, $\Delta\theta_{Y,M}$, and $\Delta\theta_{P,M}$ are the geometric error correction factor and terms; and $\Phi_N$ is the phase contribution from non-linear effects other than that represented by the geometric term in Equation (41) and where geometric and other non-cyclic affects from the reference beam path have been omitted. For those applications such as interferometers used with a column reference, the corresponding geometric and other non-cyclic affects from the reference beam path can be added to Equation (41) using the geometric and other non-cyclic affects from the measurement path as a model.

As discussed previously, the geometric error correction terms $\Delta\theta_{Y,M}$ and $\Delta\theta_{P,M}$ can be determined by locating the values of $\theta_{Y,M}$ and $\theta_{P,M}$ for which $$\frac{\partial \Phi}{\partial \theta_{Y,M}} = 0, \quad (42)$$

$$\frac{\partial \Phi}{\partial \theta_{P,M}} = 0, \quad (43)$$

as a function of $[l_M + l_{I,M}(n_a/n_I)]$ where affects of Abbé offsets are taken into account. The residual non-linear error $\Phi_N$ can determined from data that is similar to the data used in determination of the geometric error correction terms $\Delta\theta_{Y,M}$ and $\Delta\theta_{P,M}$, and may also be determined using an iterative procedure. Iterative determination is possible where effects of non-linear errors in the determination of $\Phi_N$ for the x- and y-axis interferometers are only weakly coupled. The coupling of the non-linear errors occurs when the stage mirror yaw angle $\theta_{Y,M}$ is measured with the interferometer on the axis normal to the axis being characterized for non-linear error correction. The stage mirror yaw angle $\theta_{Y,M}$ should be measured with the interferometer on the axis normal to the axis being characterized for non-linear error correction because the magnitude of the non-linear errors in the stage mirror yaw angle $\theta_{Y,M}$ can be made approximately an order of magnitude or more smaller for the non-linear error correction procedure. The reason for the reduced magnitude of non-linear errors is due to the fact that non-linear errors are minimized when the beam shear is minimized, i.e., the measurement object mirror is close to the interferometer. Thus, when the x-axis is undergoing non-linear error characterization, it may be advantageous to use a line of reference marks that cause the stage to move throughout its x range of motion, but minimize the distance between the y-axis stage mirror and the rest of the y-axis interferometer. Conversely, when the y-axis is undergoing non-linear error characterization, it may be advantageous to use a line of artifacts that cause the stage to move throughout its y range, but minimize the x stage mirror displacement.

Generally speaking, the first step of non-linear error determination determines a non-linear error correction for the x-axis assuming no residual non-linear errors for either the x- or y-axes. The second step determines non-linear error correction for the y-axis using the first step x-axis correction residual non-linear error in yaw determinations, assuming no residual non-linear error for the y-axis. The third step determines a non-linear error correction for the x-axis interferometer using first and second step corrections for both the x- and y-axes, respectively. This procedure may be repeated until an acceptable convergence of the non-linear error correction term is achieved.

Specifically, in the first step values of $\Phi_x$ corresponding to $\Phi$ for the x-axis interferometer are obtained for a linear array of reference marks as a function of respective x-axis parameters $[l_M + l_{I,M}(n_a/n_I)]_x$, $\theta_{Y,M,y}$, and $\theta_{P,M,x}$ for y-axis parameter $[l_M + l_{I,M}(n_a/n_I)]_y$ at a minimum value. The measured values of $\Phi_x$ corrected for the respective geometric error term, i.e., $$\Phi_x + \quad (44)$$
$$4n_a k \left( l_{M,x} + l_{I,M,x} \frac{n_a}{n_I} \right) [(\theta_{Y,M,y} - \Delta\theta_{Y,M,y})^2 + (\theta_{P,M,x} - \Delta\theta_{P,M,x})^2] -$$
$$2k(X_1 + X_2),$$

is then fit with the following parametric representation of $\Phi_{N,x}$, $$\Phi_{N,x} = \sum_{r=1} \sum_{s=0} \sum_{u=0} \left\{ \begin{array}{l} a_{r,s,u,x}[l_M + l_{I,M}(n_a/n_I)]_x^r \times \\ (\theta_{Y,M,y} - \Delta\theta_{Y,M,y})^s (\theta_{P,M,x} - \Delta\theta_{P,M,x})^u \end{array} \right\}, \quad (45)$$
$$s + u \neq 0,$$

taking into account properly the respective affect of the Abbé offset in the pitch and yaw directions and assuming that $\Phi_{N,y} = 0$ when determining $\theta_{Y,M,y}$ with the y-axis interferometer.

Note that there is a limitation in Equation (45) with respect to s and u, i.e., $s+u\neq 0$. This limitation removes a linear term in $[l_M + l_{I,M}(n_a/n_I)]_x$ and is imposed because such an error is not measurable in the outlined procedure to determine $\Phi_{N,x}$ and because such an error is equivalent to a scale change which is absorbed in the scale factor $\zeta_x$. In the second step, values of $\Phi_y$ corresponding to $\Phi$ for the y-axis interferometer are obtained for a linear array of artifacts as a function of respective y-axis parameters $[l_M + l_{I,M}(n_a/n_I)]_y$, $Y_1$, $Y_2$, $\theta_{Y,M,x}$, $\theta_{Y,M,y}$, and $\theta_{P,M,y}$ for x-axis parameter $[l_M + l_{I,M}(n_a/n_I)]_x$ at a minimum value. The measured values of $\Phi_y$ corrected for the respective geometric error term, i.e., $$\Phi_y + \tag{46}$$
$$2pn_a k \left( l_{M,y} + l_{I,M,y} \frac{n_a}{n_I} \right) [(\theta_{Y,M,x} - \Delta\theta_{Y,M,x})^2 + (\theta_{P,M,y} - \Delta\theta_{P,M,y})^2] -$$
$$2k(Y_1 + Y_2),$$

is then fit with the following parametric representation of $\Phi_{N,y}$, $$\Phi_{N,y} = \sum_{r=1} \sum_{s=0} \sum_{u=0} \left\{ \begin{array}{l} a_{r,s,u,y} [l_M + l_{I,M}(n_a/n_I)]_y^r \times \\ (\theta_{Y,M,x} - \Delta\theta_{Y,M,x})^s (\theta_{P,M,y} - \Delta\theta_{P,M,y})^u \end{array} \right\}, \tag{47}$$
$$s + u \neq 0,$$

taking into account properly the respective affect of the Abbé offset in the pitch and yaw directions and using the set of $\Phi_{N,x}$ in the computation of $\theta_{Y,M,x}$ and $\Delta\theta_{Y,M,x}$ from the x-axis interferometer.

The third step is an iterative step to correct for the assumption made in the first step that $\Phi_{N,y}=0$. For the third step, the first step is repeated except that the $\Phi_{N,x}$ obtained in the first step and the $\Phi_{N,y}$ obtained in the second step are used in the computation of $\theta_{P,M,x}$ and $\Delta\theta_{P,M,x}$ and $\theta_{Y,M,y}$ and $\Delta\theta_{Y,M,y}$, respectively. Generally, the iterative procedure converges rapidly and additional iterative steps beyond the third step may not be necessary.

Although the foregoing techniques for reducing errors in interferometer 300 are described in detail with respect to an HSPMI, the techniques may be applied to other types of interferometer. For example, the error reducing techniques can be applied to multiple axis interferometers. Examples of multiple axis metrology systems are disclosed in U.S. Pat. No. 6,313,918, entitled "SINGLE-PASS AND MULTI-PASS INTERFEROMETRY SYSTEMS HAVING A DYNAMIC BEAM-STEERING ASSEMBLY FOR MEASURING DISTANCE, ANGLE, AND DISPERSION," in U.S. patent application Ser. No. 10/352,616, filed Jan. 28, 2003 and entitled "MULTIPLE-PASS INTERFEROMETRY," and in U.S. patent application Ser. No. 10/351,707, filed Jan. 27, 2003 and entitled "MULTIPLE DEGREE OF FREEDOM INTERFEROMETER," all by Henry A. Hill.

Figure 6A:
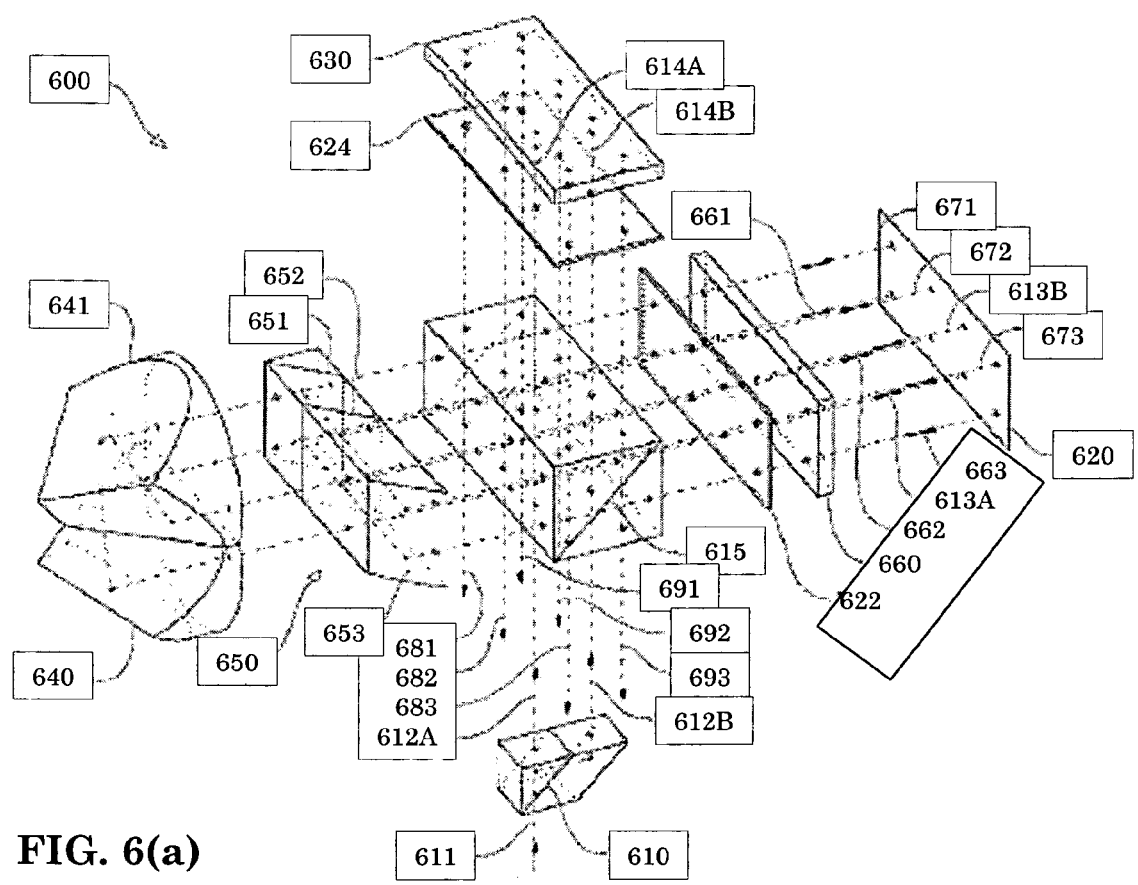
FIG. 6(a) is an exploded perspective view of a multi-axis interferometer with six parallel measurement axes.

Referring to FIG. 6(a), an example of a multi-axis plane mirror interferometer is interferometer 600, which directs multiple measurement beams to each contact a measurement object 620 (e.g., a plane mirror measurement object) twice. Interferometer 600 produces multiple output beams 681-683 and 691-693 each including interferometric information about changes in distance between the interferometry system and the measurement object along a corresponding measurement axis.

Interferometer 600 has the property that the output beams each includes a measurement component that makes one pass to the measurement object along one of two common measurement beam paths before being directed along separate measurement beam paths for the second pass to the measurement object. Similar interferometers are disclosed in commonly owned U.S. patent application Ser. No. 10/351,707 by Henry, A. Hill filed Jan. 27, 2003 and entitled "MULTIPLE DEGREE OF FREEDOM INTERFEROMETER," the contents of which are incorporated herein by reference.

Interferometer 600 includes a non-polarizing beam splitter 610, which splits a primary input beam 611 into two secondary input beams 612A and 612B. Interferometer 600 also includes a polarizing beam splitter 615, which splits secondary input beams 612A and 612B into primary measurement beams 613A and 613B, and primary reference beams 614A and 614B, respectively. Interferometer 600 directs primary measurement beams 613A and 613B along paths that contact measurement object 620 at different locations in a vertical direction. Similarly, primary reference beams 614A and 614B are directed along reference beam paths that contact a reference mirror 630 at different locations. Interferometer 600 also includes quarter wave plates 622 and 624. Quarter wave plate 622 is located between polarizing beam splitter 615 and measurement object 620, while quarter wave plate 624 is located between polarizing beam splitter 615 and reference mirror 630. The quarter wave plates rotate by 90° the polarization state of double passed beams directed between the polarizing beam splitter and the measurement object or reference mirror. Accordingly, the polarizing beam splitter transmits an incoming beam that would have been reflected in its out-going polarization state.

The following description pertains to primary measurement beam 613A and primary reference beam 614A. Interferometer 600 directs primary measurement beam 613B and primary reference beam 614B along analogous paths. Polarizing beam splitter (PBS) 615 transmits reflected primary measurement beam 613B, which is reflected back towards PBS 615 by a retroreflector 640 (a similar retroreflector 641 reflects primary measurement beam 613B). A compound optical component 650 including non-polarizing beam splitters 651 and 652 and reflector 653 split primary measurement beam 613A into three secondary measurement beams 661, 662, and 663. PBS 615 transmits the three secondary measurement beams, which propagate along paths that contact measurement object 620 at three different positions in a horizontal plane shared by primary measurement beam 613A. PBS 615 then directs the three secondary measurement beams reflected from measurement object 620 along output paths.

PBS 615 reflects primary reference beam 614A towards retroreflector 640. As for the primary measurement beam, optical component 650 splits primary reference beam 614A reflected by retroreflector 640 into three secondary reference beams 671, 672, and 673. PBS 615 reflects secondary reference beams 671, 672, and 673 towards reference mirror 630 along paths at three different positions in a plane shared by primary reference beam 614A. PBS 615 transmits secondary reference beams 671, 672, and 673 reflected from reference object 630 along output paths so that they overlap with measurement beams 661, 662, and 663 to form output beams 681, 682, and 683, respectively. The phase of the output beams carries information about the position of the measurement object along three measurement axes defined by the primary measurement beam's path and the secondary measurement beams' paths.

Interferometer 600 also includes a window 660 located between quarter wave plate 622 and measurement object 620.

Figure 6B:
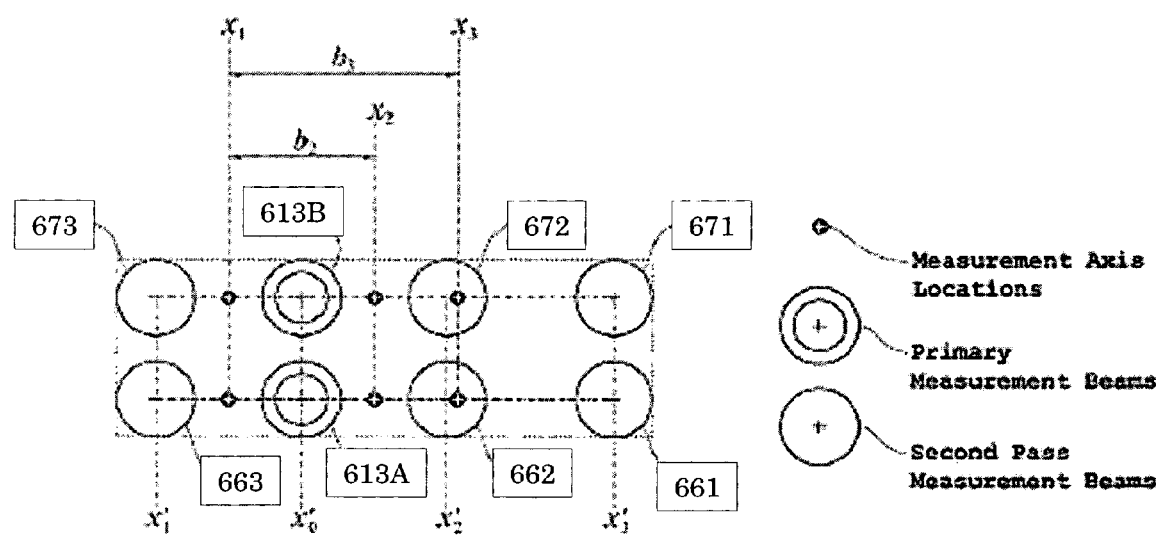
FIG. 6(b) shows the relative location of the measurement beams and measurement axes at the measurement object for the multi-axis interferometer shown in FIG. 6(a).

The pattern of measurement beams incident on a plane mirror measurement object is shown in FIG. 6(b). The angle of incidence of measurement beams at the mirror surface is nominally zero when the measurement axes are parallel to the x-axis of a coordinate system. The locations of the measurement axes of the top multiple-axis/plane interferometer corresponding to $x_1$, $x_2$, and $x_3$ are shown in FIG. 6(b). The spacings between measurement axes corresponding to $x_1$ and $x_2$ and to $x_1$ and $x_3$ are $b_2$ and $b_3$, respectively. In general, $b_2$ and $b_3$ can vary as desired. $b_2$ can be the same as or different from $(b_3-b_2)$. In some embodiments, the axis spacing can be relatively narrow (e.g., about 10 cm or less, about 5 cm or less, about 3 cm or less, about 2 cm or less). For example, where the resolution of a measurement depends on the spacing the axes, having relatively narrow spacing between at least two of the measurement axes can provide increased resolution in a measurement.

Implementing Error Corrections

In general, error corrections can be implemented in a variety of different ways. In the following discussion two procedures for making error corrections are presented. The first procedure is used to determine the geometrically corrected measurement object mirror displacement for a given phase measurement. The second procedure is used to determine the phase the interferometer will read when a point on the wafer is positioned at a fixed point in the measurement coordinate system, such as in the center of an off-axis alignment scope. Both implementations assume stage mirrors are monitored along six different axes in the x-direction, and along six different axes in the y-direction. These measurements can be made using, for example, six-axis interferometers, such as interferometer 600 described supra.

In general terms, geometric error corrected measurements of measurement object mirror displacements are obtained by first converting measured interferometer phases to uncorrected values of stage displacement along respective measurement axes. These uncorrected values of stage displacement are then used to determine stage mirror orientation in yaw and pitch and geometric error correction terms in yaw and pitch. Finally, the uncorrected values of stage displacement, stage mirror orientation in yaw and pitch, geometrical error correction factors and terms in yaw and pitch, and other nonlinear error correction terms are used to calculate geometrically corrected displacements.

First Procedure

Figure 7:
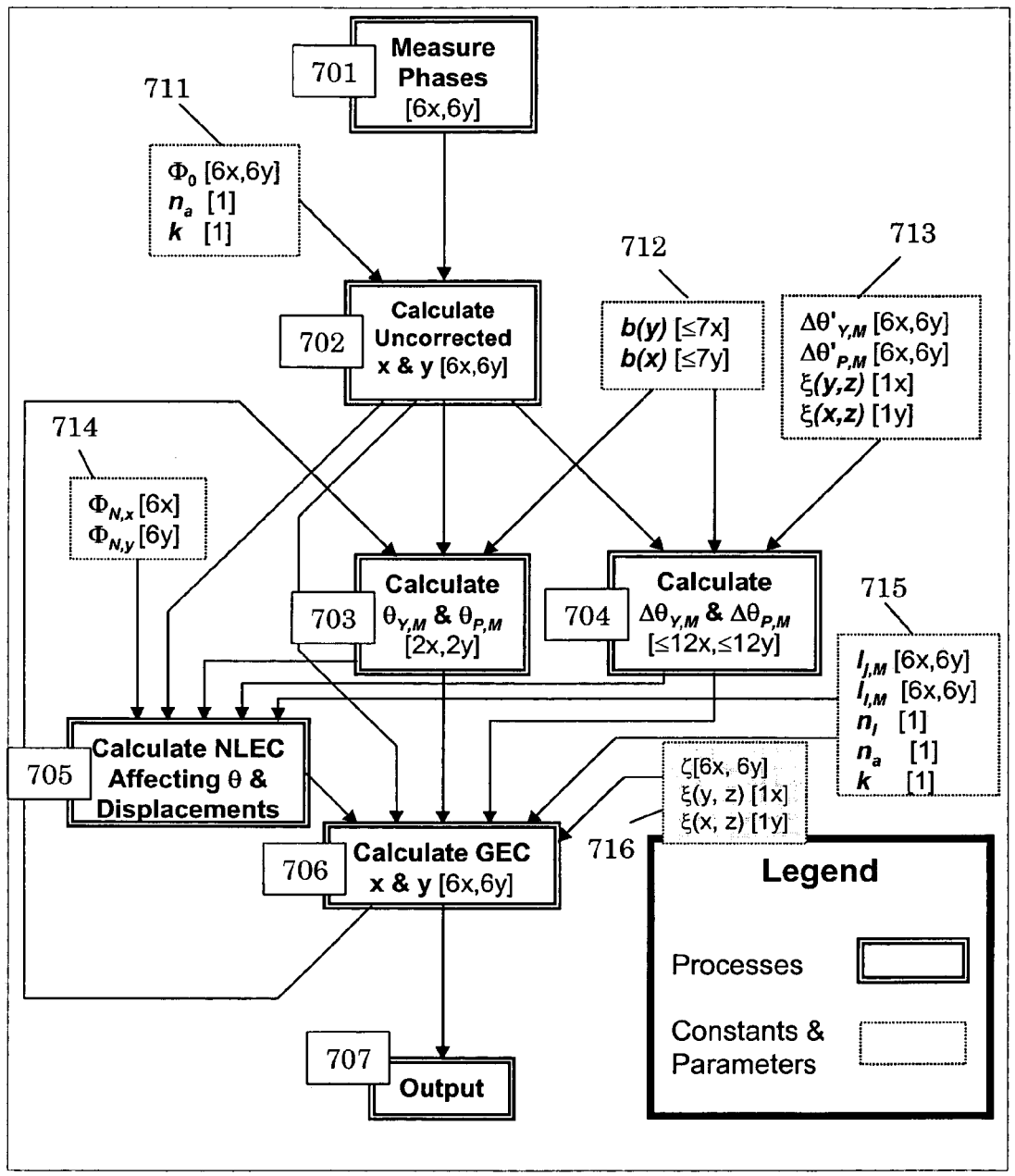
FIG. 7 is a flow chart showing steps in a procedure for correcting interferometer phase measurements for non-linear errors and geometric errors.

Referring to FIG. 7, a flow chart for the procedure includes seven principle steps, illustrated as steps 701-707, to determine the geometrically corrected measurement object mirror displacement for a given phase measurement. In addition, the flow chart depicts information that is known a priori or calculated in some earlier performed procedure (e.g., as result of an earlier calibration procedure or calculation) in boxes 711-716. This information includes constants or values of functions used to determine stage position. The numbers in square brackets show the number of output values of the respective box for a stage metrology system employing a six measurement axis interferometer on the x-displacement axis, and a six measurement axis interferometer on the y-displacement axis. In the event that the interferometers are being used with, for example, a column reference, the procedure should be adapted to include geometric corrections for the reference beam axes.

The first step in the procedure, step 701, is to measure a phase for each interferometer measurement axis. Six phases are measured by the x-axis interferometer and six phases are measured by the y-axis interferometer.

Six measurement axis phases per interferometer are output to step 702. Additional inputs for this step include constants representing six measurement axis phases, $\Phi_0$, from the each interferometer at an initial reference position (from 711) and constants representing the wavenumber k (from 711), and the average refractive index of air in the measurement paths $n_a$ (from 711). In step 702, the following formula is used to determine the uncorrected relative path length in air $L_U$ from the integrated phase difference between the measurement axis phase $\Phi$ and the phase at the initial reference position $\Phi_0$:

$$L_U = \frac{\Phi - \Phi_0}{4n_a k} \tag{48}$$

Step 702 then outputs six values of uncorrected measurement axis displacement $L_U$ for each interferometer. These are output to step 703. In addition, the six values of uncorrected measurement axis displacement $L_U$ for each interferometer are output to step 704 and 706. Additional inputs for step 703 functions representing seven spacing distances between the measurement axis beams for each interferometer (from 712).

In step 703, the process of how the output is obtained can vary. In some embodiments, for example, data from only three beams per interferometer are used to determine stage mirror yaw and pitch. Values of $L_U$ from 3 outermost beams of each interferometer can be used to determine the pitch and yaw angles of each stage mirror according to the following formulas:

$$\theta^x_{Y,M} = \frac{x_3^T - x_1^T}{b_3^T(x_1^T)}; \theta^x_{P,M} = \frac{x_1^T - x_1^B}{b_1^v(x_1^T)} \tag{49}$$

$$\theta^y_{Y,M} = \frac{y_3^T - y_1^T}{b_3^T(y_1^T)}; \theta^y_{P,M} = \frac{y_1^T - y_1^B}{b_1^v(y_1^T)}$$

Here the superscript on the angular coordinate indicates the measurement axis of the applicable interferometer. The superscript on the position coordinates and spacing parameters identifies top and bottom level beams, while the subscript identifies the lateral order of the beams. The superscript of the beam spacing parameter b denotes whether the beam pair is on the top, bottom, or is vertically oriented. The subscript denotes laterally which beam pair is involved in the calculation. Note that the interferometer beams do not necessarily travel in precisely the same direction, so the beam spacing may be a function of the stage displacement. The beam spacing may be determined after the interferometer has been mounted on the stage or a determination of the beam spacing as a function of measurement object displacement may be determined at the factory.

The calculated yaw and pitch angles $\theta_{Y,M}, \theta_{P,M}$ for each interferometer mirror are sent to step 706.

Step 704 uses variables representing six uncorrected measurement axis displacements from each interferometer (from step 702), constants representing the angular geometric correction factors $\Delta\theta'_{Y,M}, \Delta\theta'_{P,M}$ for yaw and pitch for each measurement axis beam of each interferometer (from 713) and functions representing mirror maps of the x-axis and y-axis stage mirrors $\xi(y,z), \xi(x,z)$, respectively (from 713). The functional representations of the mirror map, $\xi(y,z)$, express the local displacements of the object mirror described in FIG. 4b, $X_1$, $X_2$ parametrically. Functions representing $\leq 7$ spacing distances between the measurement axis beams, for each interferometer (from 712) are also input to step 704.

Mirror map data is transformed into geometric error correction terms by applying the following formulas for the x and y axes, respectively:

$$\Delta\theta''_{Y,M} = \frac{\partial \xi_3(y,z)}{\partial y} - \frac{\partial \xi_1(y,z)}{\partial y}, \quad \Delta\theta''_{P,M} = \frac{\partial \xi_3(y,z)}{\partial z} - \frac{\partial \xi_1(y,z)}{\partial z}, \quad (50)$$

$$\Delta\theta''_{Y,M} = \frac{\partial \xi_3(x,z)}{\partial x} - \frac{\partial \xi_1(x,z)}{\partial x}, \quad \Delta\theta''_{P,M} = \frac{\partial \xi_3(x,z)}{\partial z} - \frac{\partial \xi_1(x,z)}{\partial z}, \quad (51)$$

where the $\xi_1$ term is the surface figure of the measurement object mirror where the second pass beam of measurement axis 1 is incident, and the $\xi_3$ term is the surface figure of the measurement object mirror where the second pass measurement beam of measurement axis 3 is incident. Alternatively equations (50) and (51) can be expressed in terms of the stage mirror map function and the displacements between the second pass measurement beams relative to a coordinate system. Assuming that the coordinates of mirror map function $\xi$ is defined at the point of incidence of the first pass primary measurement beam, equations (50) and (51) can be expressed as equations (52) and (53):

$$\Delta\theta''_{Y,M} = \frac{\partial \xi[y+b_2(x),z]}{\partial y} - \frac{\partial \xi(y-b_3(x)+b_2(x),z)}{\partial y}, \quad (52)$$

$$\Delta\theta''_{P,M} = \frac{\partial \xi[y+b_2(x),z]}{\partial z} - \frac{\partial \xi(y-b_3(x)+b_2(x),z)}{\partial z},$$

$$\Delta\theta''_{Y,M} = \frac{\partial \xi[y+b_2(x),z]}{\partial y} - \frac{\partial \xi(y-b_3(x)+b_2(x),z)}{\partial y}, \quad (53)$$

$$\Delta\theta''_{P,M} = \frac{\partial \xi[y+b_2(x),z]}{\partial z} - \frac{\partial \xi(y-b_3(x)+b_2(x),z)}{\partial z}.$$

The effects of beam shear at the stage mirrors due to rotation of stage mirrors have been omitted in equations (52) and (53) because it is likely that these effects will be negligible.

The angular geometric error correction factors are then obtained by inserting the factors $\Delta\theta'_{Y,M}, \Delta\theta'_{P,M}$ and the terms $\Delta\theta''_{Y,M}, \Delta\theta''_{P,M}$ into equations (32).

Step 704 outputs six yaw and six pitch angular geometric correction factors $\Delta\theta_{Y,M}, \Delta\theta_{P,M}$ for each interferometer to step 706.

Inputs to step 705 include variables representing six uncorrected measurement axis displacements from each interferometer (from step 702), functions representing the nonlinear error correction for each beam of each interferometer (from 714), terms representing the stage mirror yaw and pitch angles for each interferometer (from step 703), terms representing the yaw and pitch angular geometric correction factors for each beam of each interferometer (from step 704), constants for each beam of each interferometer representing the one-way measurement beam path length from the object mirror to the node of the retroreflector through glass (from 715), constants for each beam of each interferometer representing the one-way measurement beam path length from the object mirror to the node of the retroreflector through air for a given artifact (from 715), a constant representing the index of refraction in glass (from 715), a variable representing the index of refraction of air for the measurement beam during data acquisition (from 715), and a constant representing the wavenumber k (from 715).

Step 705 outputs six terms, each representing a non-linear phase correction $\Phi_N$ for each interferometer axis.

Inputs to step 706 include variables representing six uncorrected measurement axis displacements $L_U$ from each interferometer axis (from step 702), constants representing the measurement path length through glass to the apex of the retroreflector for each beam $l_{I,M}$ (from 715), the path length through air for each beam at an initialization position $l_{0,M}$ (from 715), the index of refraction in glass $n_I$ (from 715), the wavenumber k (from 715), a variable representing the index of refraction $n_a$ in the air during the measurement (from 715), terms representing the stage mirror yaw and pitch angles $\theta_{Y,M}, \theta_{P,M}$ for each interferometer (from step 703), terms representing the yaw and pitch angular geometric correction factors $\Delta\theta_{Y,M}, \Delta\theta_{P,M}$ for each beam of each interferometer (from step 704), constants representing the scale geometric correction factor $\zeta$ for each beam of each interferometer (from 716), terms representing the object mirror surface figure, $\xi(y,z), \xi(x,z)$ (from 716), and terms representing nonlinear phase correction $\Phi_N$ for each interferometer axis (from step 705).

Both the x- and y-axis interferometers provide stage yaw values $\theta_{Y,M}$.

For the case where stage mirror location is to be determined equations (18) and (31) are used to obtain geometrically corrected path length in air L with the following formula:

$$L - L_0 = \frac{1}{\zeta}\left\{\begin{array}{c} L_U + \left(l_M + l_{I,M}\frac{n_a}{n_I}\right)[(\theta_{Y,M} - \Delta\theta_{Y,M})^2 + (\theta_{P,M} - \Delta\theta_{P,M})^2] + \\ \frac{(X_1+X_2)}{2n_a\zeta} - \frac{(X_1+X_2)_0}{2n_a\zeta} + \frac{\Phi_N}{4n_a k} \end{array}\right\} \quad (54)$$

The last term in equation (54) is the contribution to the path length due to the non-linear error determined in step 705.

In step 707, six values of corrected displacements $L-L_0$, each corresponding to an interferometer axis are output to the user.

Once values of displacement are obtained, the user has the option to iterate to obtain more accurate values. If this option is desired, the displacement values can be used to revise the values of $\theta_{Y,M}, \theta_{P,M}$ calculated in step 703, which will in turn provide more accurate values for the geometric and non-linear path length corrections. Due to the relatively small value of the correction, a practical convergence may only require a single iteration.

Second Procedure

Figure 8:
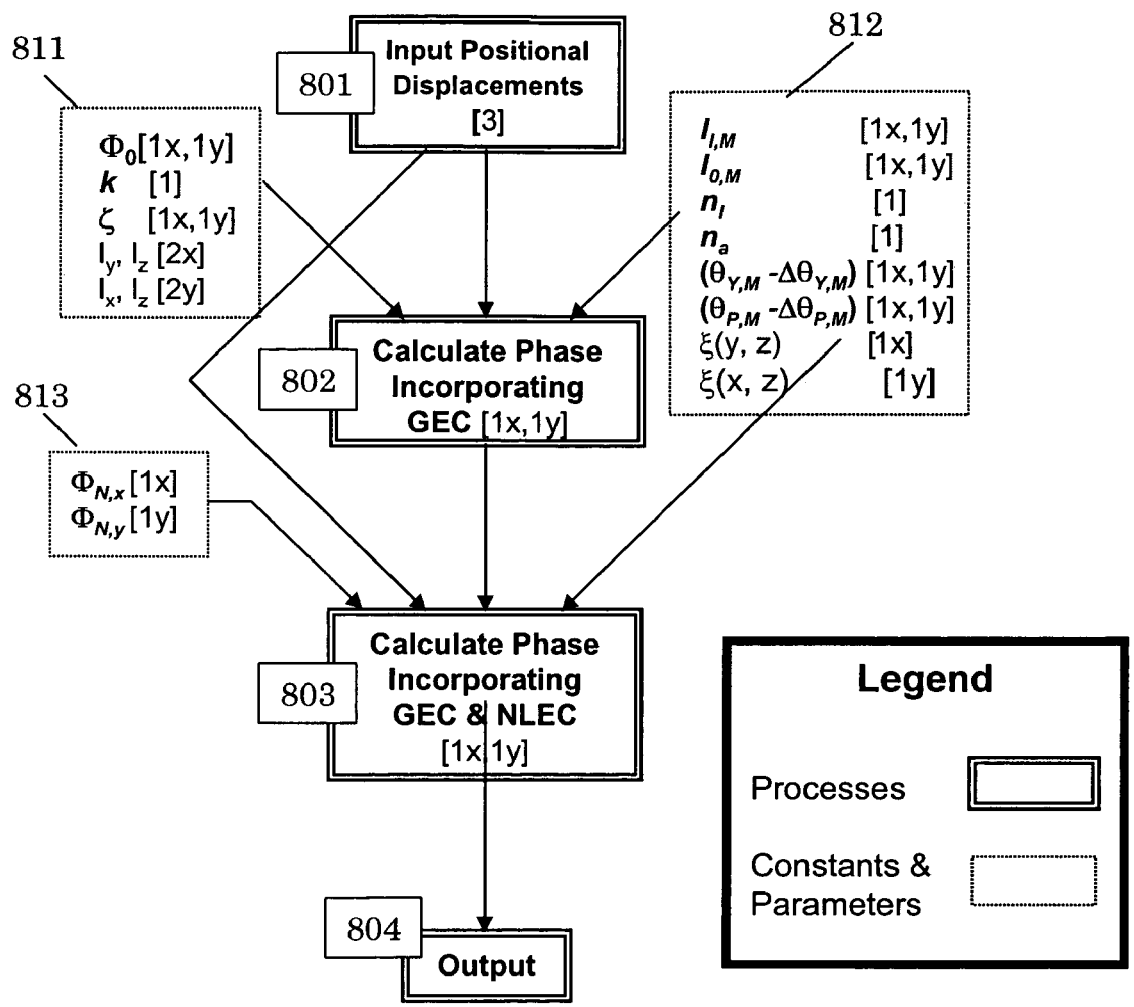
FIG. 8 is a flow chart showing steps in a procedure for determining a corrected phase when a reference mark and alignment scope are aligned.

Referring now to FIG. 8, the method refers to four principle steps, labeled 801-804, to determine the phase the interferometer will read when a point on the wafer is positioned at a fixed point in the measurement coordinate system. Also shown, in boxes 811-813 in this flow chart, is information that is known a priori or previously calculated. Similarly to the flow chart shown in FIG. 7, the numbers in square brackets show the number of output values of the respective box for a stage metrology system employing a six measurement-axis interferometer on the x displacement axis, and a six measurement-axis interferometer on the y displacement axis. In the event that the interferometers are being used with, for example, a column reference, the procedure should be adapted to include geometric corrections for the reference beam axes. While the steps that follow describe procedures for measuring the phase from the x-axis interferometer, analogous procedures are used to find the phase from the y-axis interferometer.

Although the procedure assumes that the interferometers employed each have six measurement axes, data from a single axis is used for the calculation of the phase (although the other axes may be used to determine interferometer orientation).

The first step in the procedure, step 801, is to determine the specific point on the wafer to superimpose with the scope reference point. This point is set as the origin of the wafer coordinate system. Coordinates representing the <insert expression>(x',y') position of the intersection of the measurement axis and the measurement object mirror in the wafer coordinate system <insert expression>($l_{D,x'}$,$l_{D,y'}$,0) are output to step 802. Other inputs to step 802 include constants representing the Abbé offsets <insert expression>$l_y$ and <insert expression>$l_z$ (from 811) in the interferometer specific measurement coordinate system, constants representing the wavenumber k (from 811), the refractive index of glass $n_I$ (from 812), the interferometer specific measurement beam path length components in glass $l_{I,M}$ (from 812), and air $l_{0,M}$ (from 812), at the initialization position for each interferometer, constants representing the interferometer specific phase at the initialization position $\Phi_0$ for each interferometer (from 811), variables representing the average refractive index of air in the measurement paths $n_a$ (from 812), variables representing interferometer specific target values of $(\theta_{P,M}-\Delta\theta_{P,M})$ and $(\theta_{Y,M}-\Delta\theta_{Y,M})$ for each interferometer for control (from 812), and variables representing the interferometer specific geometric error scale factor $\zeta$ for each interferometer (from 811).

The reference point of the dye will be coincident with the reference point of the scope when $L-L_0+l_x=L_{S,x}$. Thus, the geometrically corrected phase $\Phi^G$ can be expressed by substituting this value for L into equation (36):

$$\frac{\Phi_G - \Phi_0}{4 n_a k \zeta} = L_{S,x} - \left( \frac{l_{0,M} - l_{D,x'}}{\zeta} + \frac{n_a}{n_I} \frac{l_{I,M}}{\zeta} \right) \quad (55)$$

$$[(\theta_{P,M} - \Delta\theta_{P,M})^2 + (\theta_{Y,M} - \Delta\theta_{Y,M})^2] - l_{D,x'}$$

$$\left[1 + (\theta_{P,M} - \Delta\theta_{P,M})^2 \left(\frac{1}{2} + \frac{L_{S,z}^2}{l_{D,x'}^2}\right) + (\theta_{Y,M} - \Delta\theta_{Y,M})^2 \left(\frac{1}{2} + \frac{L_{S,y}^2}{l_{D,x'}^2}\right)\right] -$$

$$L_{S,z}(\theta_{P,M} - \Delta\theta_{P,M}) - L_{S,y}(\theta_{Y,M} - \Delta\theta_{Y,M}) + \frac{(X_1 + X_2)}{2 n_a \varsigma} - \frac{(X_1 + X_2)_0}{2 n_a \varsigma}$$

Subsequently, step 802 outputs one value of geometrically corrected phase $\Phi_G$ for each interferometer. This is output to step 803. Other inputs to step 803 include variables representing the coordinates of the dye site reference point in the wafer coordinate system $(l_{x'},l_{y'},0)$ (from step 801), functions representing the nonlinear error correction for interferometer specific measurement axis of each interferometer (from 813), variables representing interferometer specific target values of $(\theta_{P,M}-\Delta\theta_{P,M})$ and $(\theta_{Y,M}-\Delta\theta_{Y,M})$ for each interferometer for control (from 812) terms representing the object mirror surface figure $\xi(y,z)$, $\xi(x,z)$ (from 812), constants representing the one-way measurement beam path length from the object mirror to the node of the retroreflector through glass for $\theta_{Y,M}=\theta_{P,M}=0$ for each interferometer (from 812), constants representing the one-way interferometer specific measurement beam path length from the object mirror to the node of the retroreflector through air for $\theta_{Y,M}=\theta_{P,M}=0$ when the stage is in its initialization position (from 812), a constant representing the index of refraction in glass $n_I$ (from 812), and a variable representing the index of refraction of air for the measurement beam during data acquisition $n_a$ (from 812).

As discussed previously in connection with non-linear errors, generally speaking, the non-linear error can be expressed functionally as a multivariate power series expansion of three variables:

$$\Phi_N = \sum_{r=1} \sum_{s=0} \sum_{u=0} \left\{ \begin{array}{l} a_{r,s,u}[l_{0,M} - l_{x'} + l_{I,M}(n_a/n_I)]^r \times \\ (\theta_{Y,M} - \Delta\theta_{Y,M})^s (\theta_{P,M} - \Delta\theta_{P,M})^u \end{array} \right\}, \; s+u \neq 0, \quad (56)$$

The target phase accounting for both geometric error corrections and non-linear error corrections, $\Phi_{G,N}$, is the sum of the geometric error correction phase and the non-linear error correction phase correction terms:

$$\Phi_{G,N} = \Phi_G + \Phi_N \quad (57)$$

In step 804, the procedure outputs one value of phase corrected for geometric and non-linear errors, $\Phi_{G,N}$, for each interferometer.

Lithography Applications

As discussed supra, interferometry systems can be used to monitor the location of a stage in a lithography tool. Lithography tools are especially useful in lithography applications used in fabricating large scale integrated circuits such as computer chips, LCD panels, and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50-100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

As discussed previously, to properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photochemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 9:
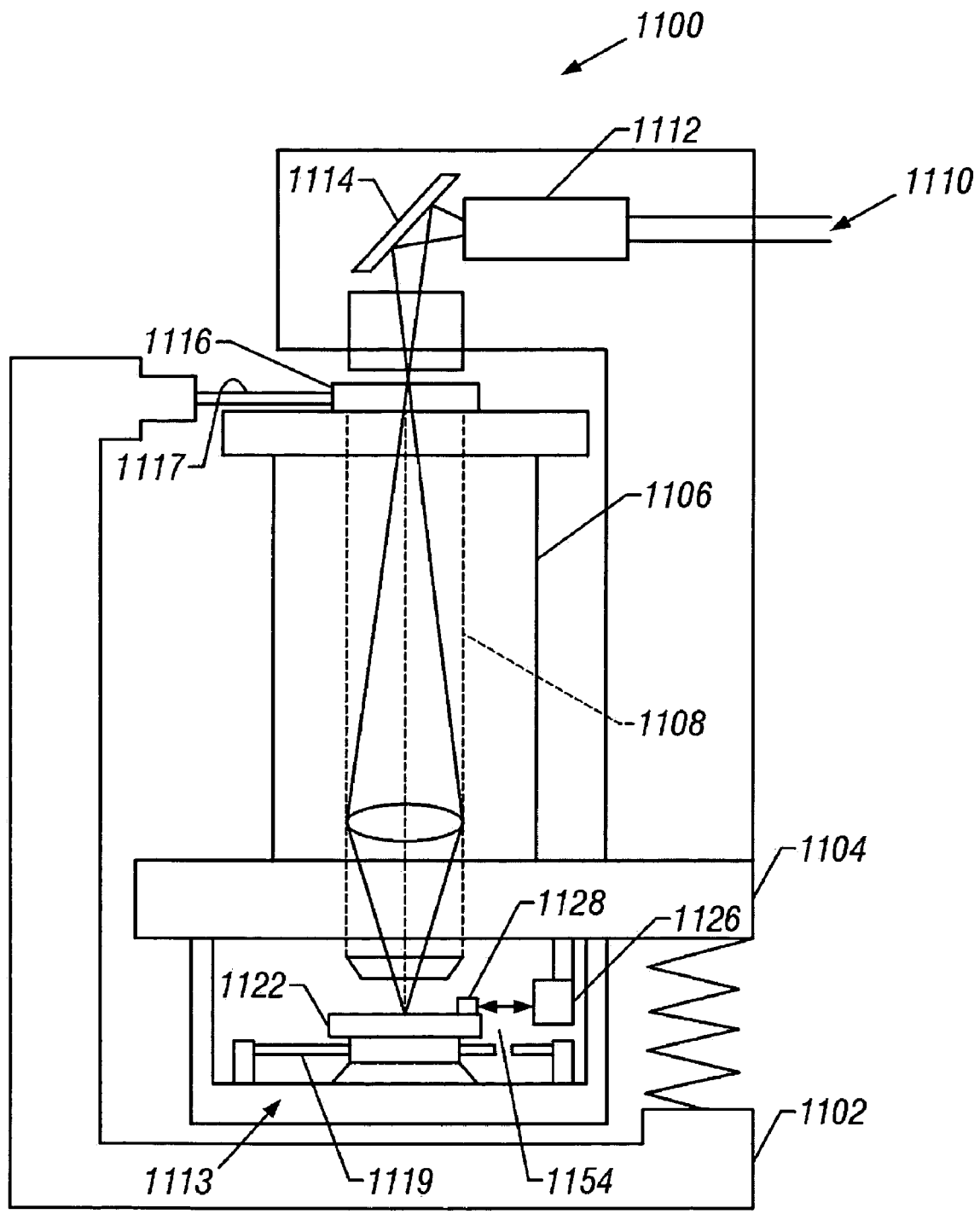
FIG. 9 is a schematic diagram of an embodiment of a lithography tool that includes an interferometer.

Another example of a lithography tool 1100 using an interferometry system 1126 is shown in FIG. 9. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1134 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1134 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 10A:
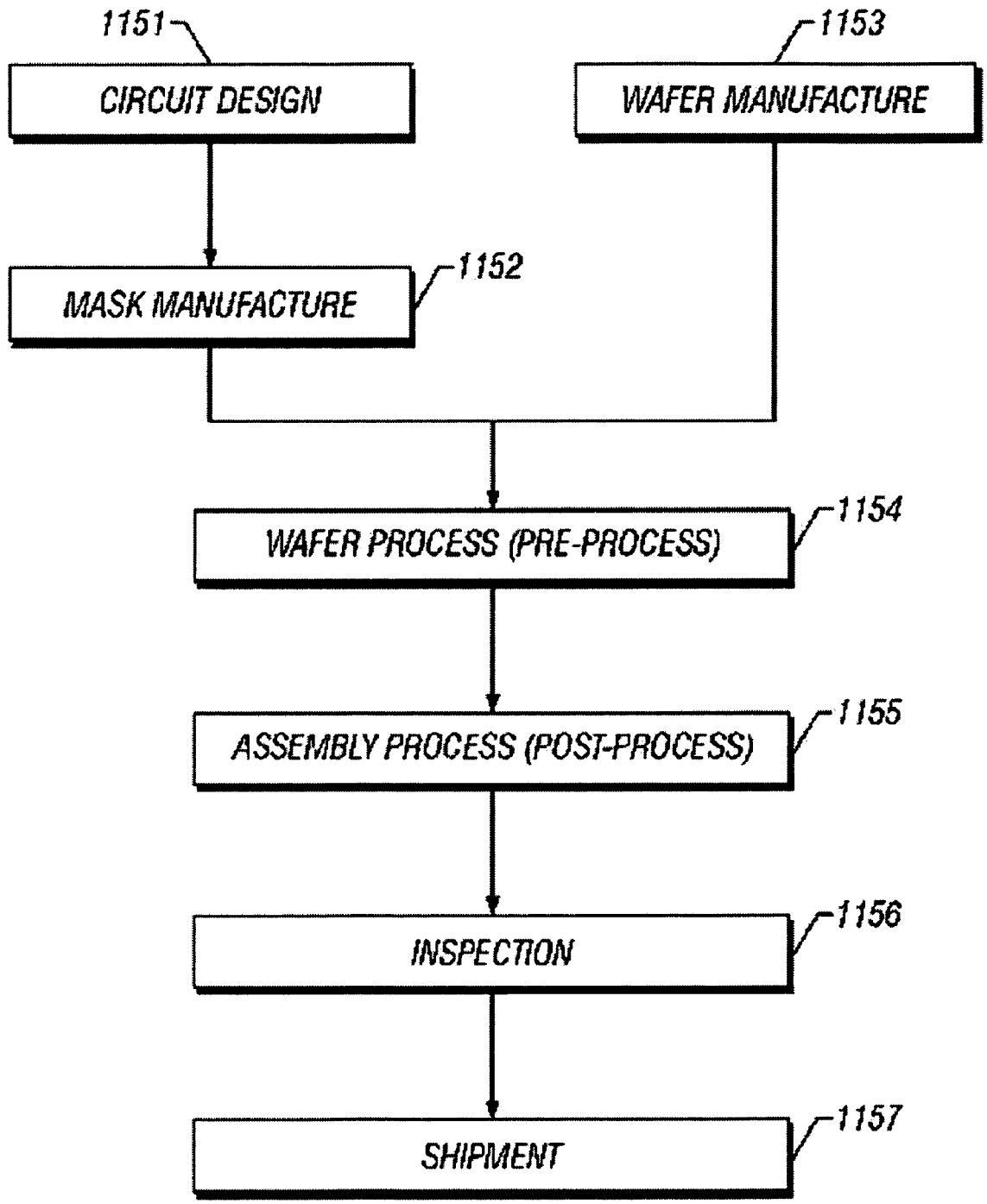
FIG. 10(a) and FIG. 10(b) are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 10(*a*) and 10(*b*). FIG. 10(*a*) is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 10B:
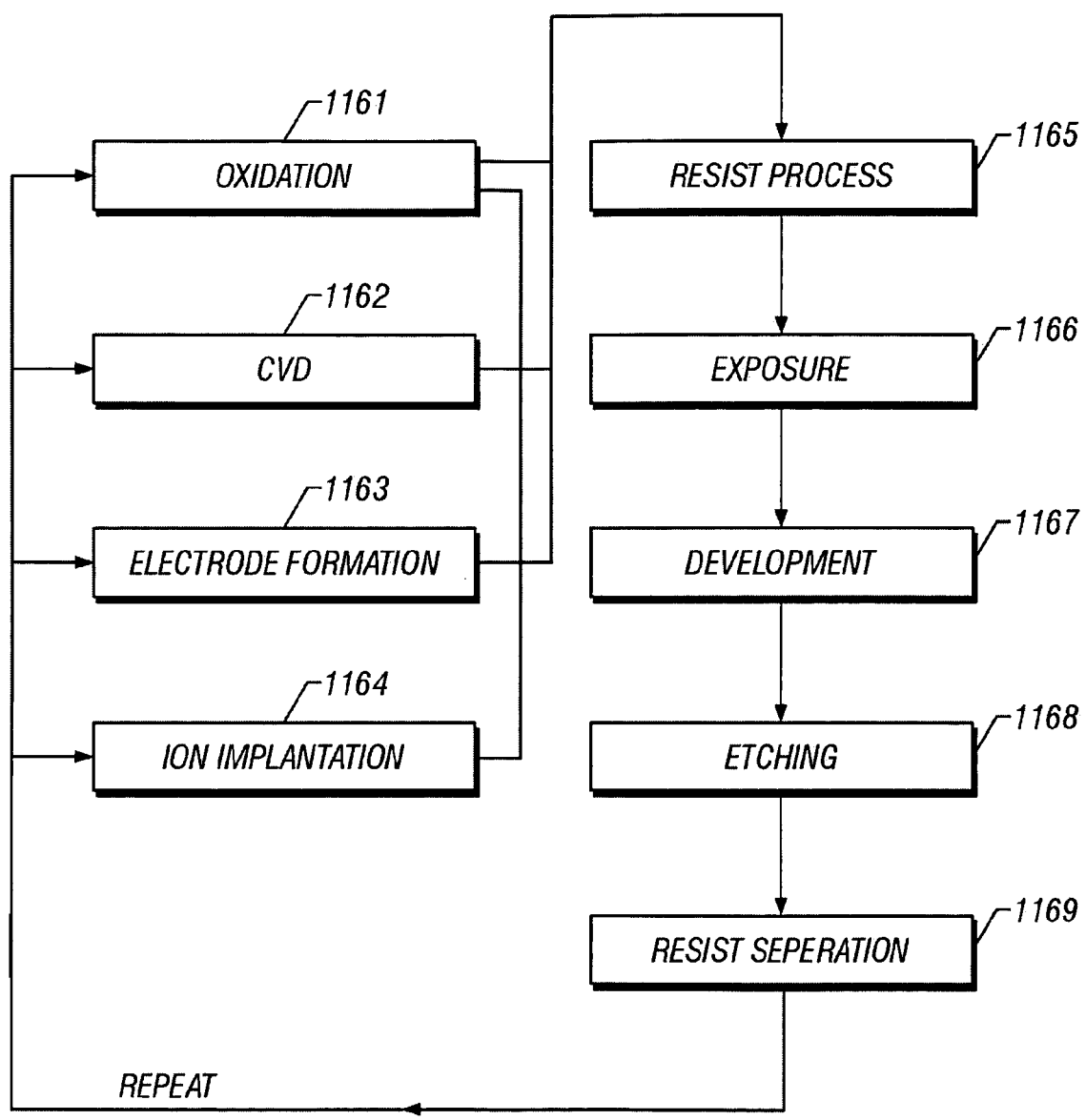

FIG. 10(b) is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 11:
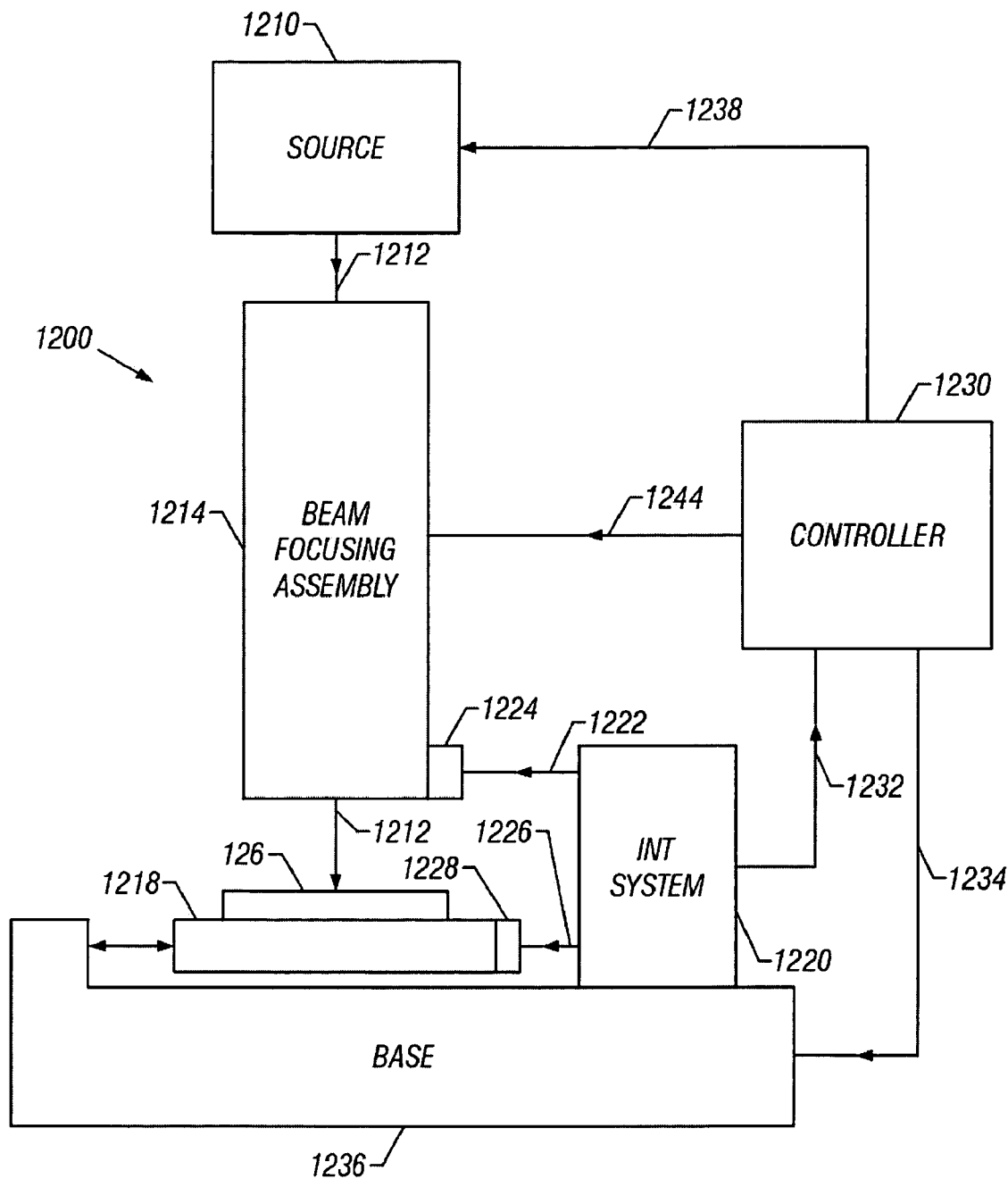
FIG. 11 is a schematic of a beam writing system that includes an interferometry system.

As an example, a schematic of a beam writing system 1200 is shown in FIG. 11. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. For example, while the interferometry systems and methods are described in the context of their application in lithography tools, more generally, the techniques disclosed herein can be implemented in other applications that utilize interferometry systems as well. As an example, interferometry systems can be used to measure the position of stages for scanning probe microscopes such as atomic force microscopes or scanning tunneling microscopes. Accordingly, other embodiments are within the scope of the following claims.

What is claimed is:

1. A method, comprising:

using an interferometer to produce an output beam comprising a phase related to an optical path difference between a path of a first beam and a path of a second beam, wherein the first beam contacts a measurement object and either the measurement object or the interferometer are coupled to a stage that is moveable within a reference frame;

monitoring variations in the phase while both varying an orientation of the stage with respect to at least one degree of freedom in the reference frame and keeping a reference mark on the stage in a common position with respect to the reference frame; and determining information based on the monitored variations, the information being related to a contribution to the optical path difference caused by a deviation of the path of the first or second beam from a nominal beam path, wherein the information is determined based on additional monitored variations of the phase associated with varying an orientation of the stage with respect to the reference frame while keeping a second alignment mark on the stage at a common position with respect to the reference frame.

2. The method of claim 1 wherein the reference mark is kept in a common position by maintaining the reference mark in alignment with an alignment tool.

3. The method of claim 2 wherein the alignment tool is an optical alignment scope.

4. The method of claim 1 wherein monitoring the variations in the phase includes monitoring the orientation of the stage with respect to the at least one degree of freedom.

5. The method of claim 4 wherein the information is related to deviations of the actual stage orientation from the monitored orientation.

6. The method of claim 5 wherein the information includes contributions to the deviations of the actual stage orientation from the monitored stage orientation due to imperfections in the interferometer.

7. The method of claim 5 wherein the measurement object is a plane mirror measurement object and the information includes contributions to the deviations of the actual stage orientation from the monitored stage orientation due to imperfections in the plane mirror.

8. The method of claim 4 wherein the stage orientation is monitored using the interferometer.

9. The method of claim 4 wherein the degree of freedom corresponds to the stage pitch in the reference frame.

10. The method of claim 4 wherein the degree of freedom corresponds to the stage yaw in the reference frame.

11. The method of claim 1 wherein the information is determined based on a difference between the phase variations monitored with the first alignment mark substantially stationary with respect to the reference frame and the additional monitored phase variations for corresponding stage orientations.

12. The method of claim 1 wherein the reference mark is a mark on a surface of the stage.

13. The method of claim 1 wherein the reference mark is a mark on a surface of a wafer, a LCD substrate, or a reticle supported by the stage.

14. The method of claim 1 wherein the measurement object is a plane mirror measurement object.

15. The method of claim 1 wherein the measurement beam contacts the measurement object more than once.

16. A method, comprising:
using an interferometry system to monitor the position of a moveable stage with respect to a reference frame; and
using information determined according to the method of claim 1 to reduce errors in the monitored position.

17. The method of claim 16 wherein monitoring the position of the stage comprises monitoring the location of a die site on a wafer supported by the stage with respect to the reference frame.

18. A lithography method for use in fabricating integrated circuits on a wafer, the method comprising:
using the method of claim 16 to monitor the position of the stage, wherein the wafer is supported on the stage;
imaging spatially patterned radiation onto the wafer; and
adjusting the position of the stage.

19. A lithography method for use in the fabrication of integrated circuits comprising:
directing input radiation through a mask to produce spatially patterned radiation;
positioning the mask relative to the input radiation;
monitoring the position of the mask relative to the input radiation using the method of claim 16; and
imaging the spatially patterned radiation onto a wafer.

20. A lithography method for fabricating integrated circuits on a wafer comprising:
positioning a first component of a lithography system relative to a second component of a lithography system to expose the wafer to spatially patterned radiation; and
monitoring the position of the first component relative to the second component using the method of claim 16.

21. A method for fabricating integrated circuits, the method comprising;
applying a resist to a wafer;
forming a pattern of a mask in the resist by exposing the wafer to radiation using the lithography method of claim 18; and
producing an integrated circuit from the wafer.

22. A method for fabricating integrated circuits, the method comprising;
applying a resist to a wafer;
forming a pattern of a mask in the resist by exposing the wafer to radiation using the lithography method of claim 19; and
producing an integrated circuit from the wafer.

23. A method for fabricating a lithography mask, the method comprising:
directing a write beam to a substrate to pattern the substrate;
positioning the substrate relative to the write beam; and
monitoring the position of the substrate relative to the write beam using the interferometry method of claim 16.

* * * * *